United States Patent
Beebe et al.

(10) Patent No.: US 11,336,204 B2
(45) Date of Patent: *May 17, 2022

(54) SYNCHRONOUS BUCK INVERTER

(71) Applicant: JABIL INC., St. Petersburg, FL (US)

(72) Inventors: Ronald Beebe, St. Petersburg, FL (US); Christopher D. Compton, St. Petersburg, FL (US); David Eckerson, St. Petersburg, FL (US); Yizhe Liu, St. Petersburg, FL (US); Salman Talebi, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/069,459

(22) Filed: Oct. 13, 2020

(65) Prior Publication Data
US 2021/0028723 A1 Jan. 28, 2021

Related U.S. Application Data

(63) Continuation of application No. 15/724,839, filed on Oct. 4, 2017, now Pat. No. 10,840,824, which is a (Continued)

(51) Int. Cl.
*H02M 7/5387* (2007.01)
*H03B 5/00* (2006.01)
(Continued)

(52) U.S. Cl.
CPC ..... *H02M 7/53871* (2013.01); *H02M 7/5387* (2013.01); *H03B 5/00* (2013.01);
(Continued)

(58) Field of Classification Search
CPC .......... H02M 7/5387; H02M 7/53871; H02M 2001/0058; H02M 2001/0025;
(Continued)

(56) References Cited

U.S. PATENT DOCUMENTS 9,660,580 B2 * 5/2017 Beebe .................. H03B 5/26
10,840,824 B2 * 11/2020 Beebe .................. H03B 5/00

* cited by examiner

*Primary Examiner* — Arnold M Kinkead
(74) *Attorney, Agent, or Firm* — Thomas J. McWilliams; Barnes & Thornburg LLP

(57) ABSTRACT

A power inverter, such as a synchronous buck power inverter, that is configured with a high frequency switching control having a (PWM) controller and sensing circuit. Controller provides a low frequency oscillating wave to effect switching control on a synchronous-buck circuit portion that includes a plurality of switches to invert every half cycle of the frequency provided by controller. The inverting process thus creates a positive and negative transition of the oscillating wave signal. A low frequency switching stage includes a further plurality of switches configured to operate as zero voltage switching (ZVS) and zero current switching (ZCS) drives Charge on an output capacitor is discharged to zero on every zero crossing of low frequency switching stage and advantageously discharges energy every half cycle. During this discharge of energy, the zero crossing distortion in the low frequency sine wave is greatly reduced.

19 Claims, 36 Drawing Sheets

Related U.S. Application Data continuation of application No. 15/251,487, filed on Aug. 30, 2016, now Pat. No. 9,935,580, which is a continuation of application No. 14/675,073, filed on Mar. 31, 2015, now Pat. No. 9,647,608.

(60) Provisional application No. 62/047,443, filed on Sep. 8, 2014.

(51) Int. Cl.
*H03B 5/26* (2006.01)
*H02M 1/00* (2006.01)

(52) U.S. Cl.
CPC ............ *H03B 5/26* (2013.01); *H02M 1/0012* (2021.05); *H02M 1/0025* (2021.05); *H02M 1/0058* (2021.05); *Y02B 70/10* (2013.01); *Y02B 90/10* (2013.01)

(58) Field of Classification Search
CPC ....... H02M 2001/0012; H02M 1/0012; H02M 1/0058; H02M 1/0025; Y02B 70/1491; Y02B 70/10; Y02B 90/10; H03L 5/00; H03B 5/00
USPC ............ 323/223; 363/123, 131, 16; 331/140
See application file for complete search history.

Full Bridge Topology x = High Frequency PWM

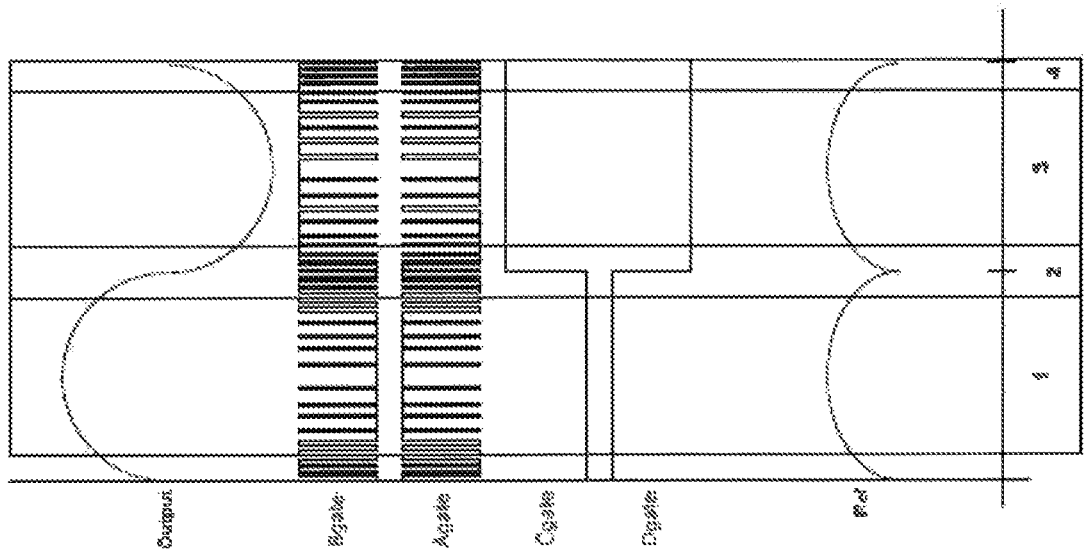

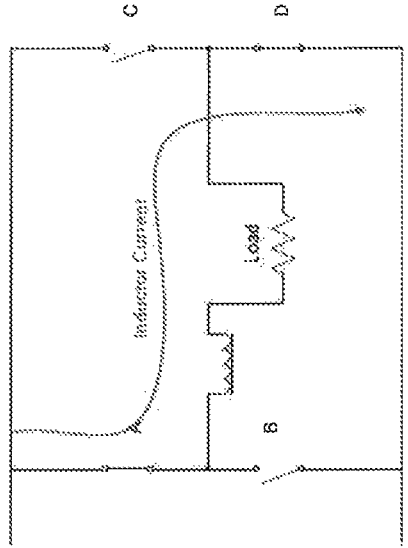
FIG. 4D
(b)
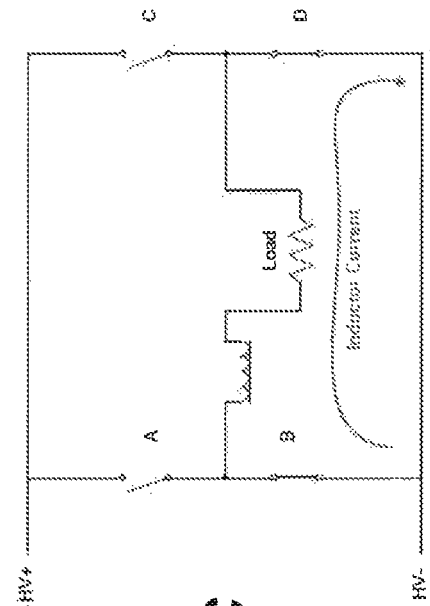
FIG. 4C
(a)
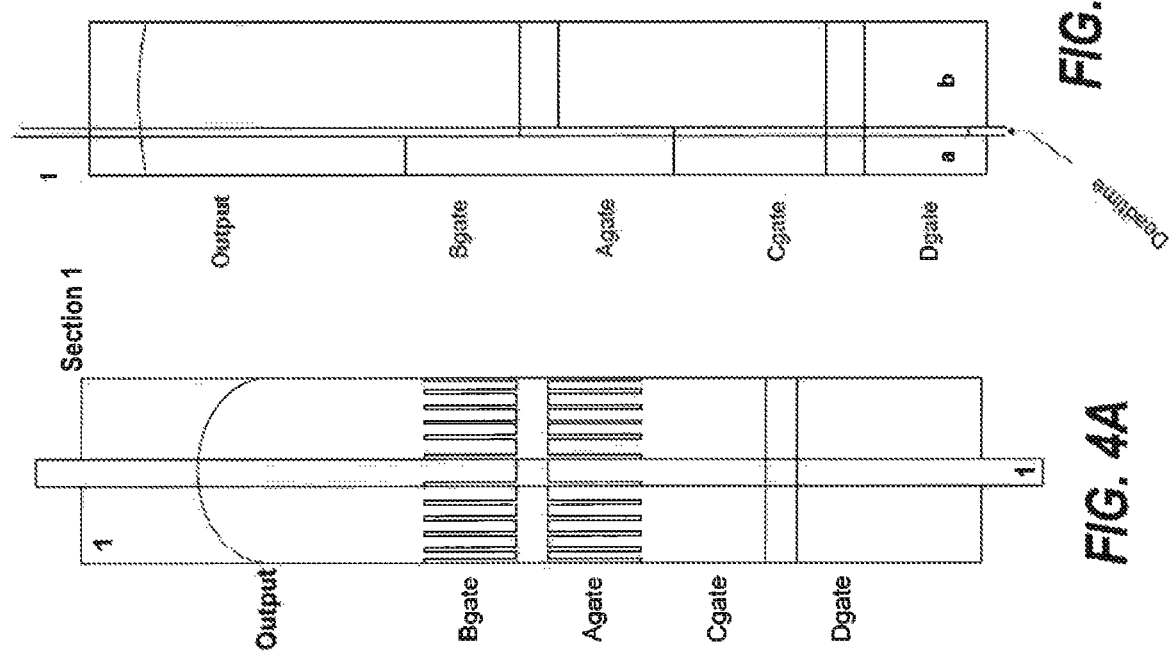
FIG. 4B
FIG. 4A

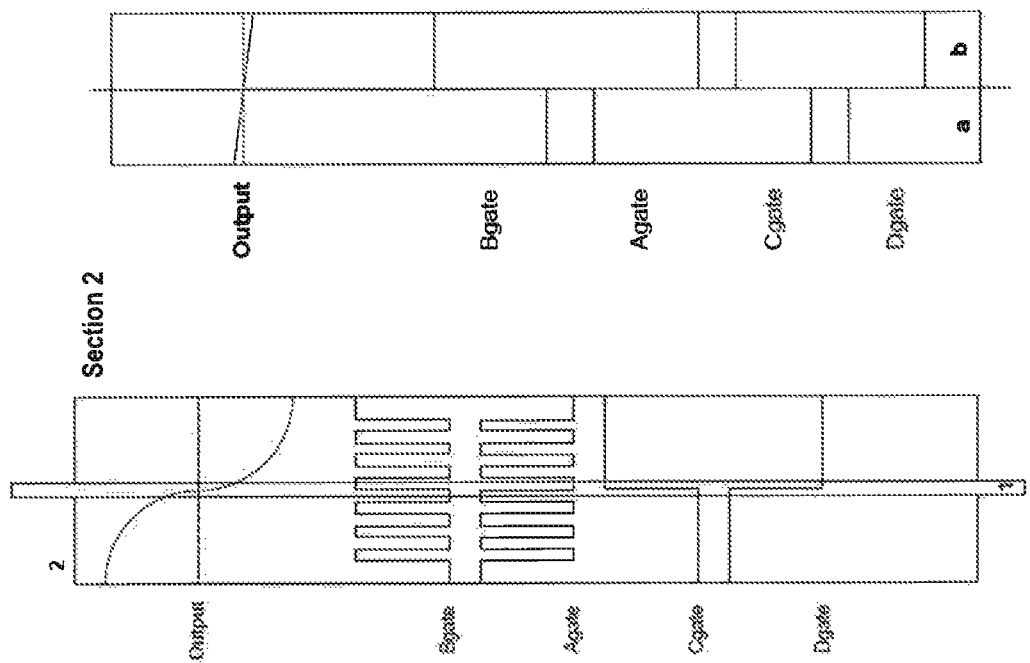
FIG. 4E
FIG. 4F
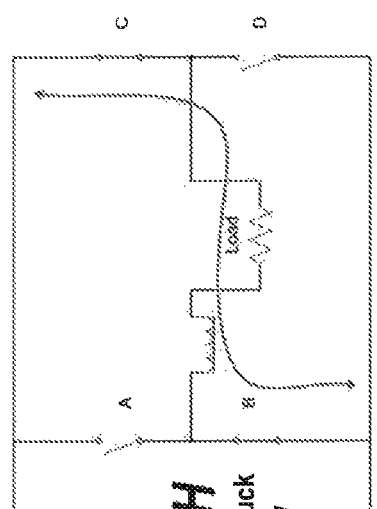
FIG. 4H
Synchronous/Buck
Current Flow
(b)
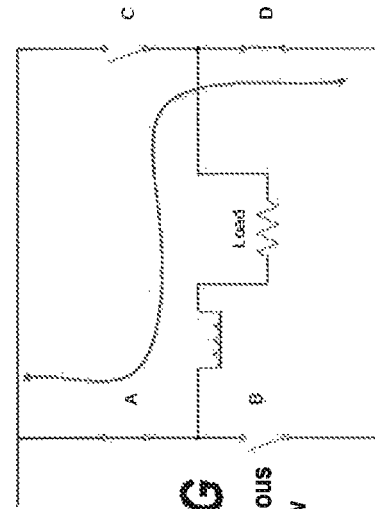
FIG. 4G
Buck/Synchronous
Current Flow
(a)

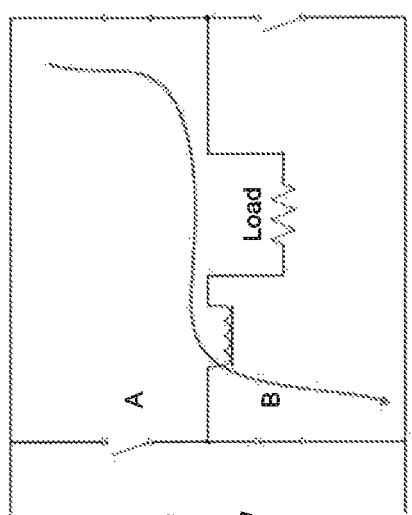
FIG. 4L
Buck
Current Flow
(b)
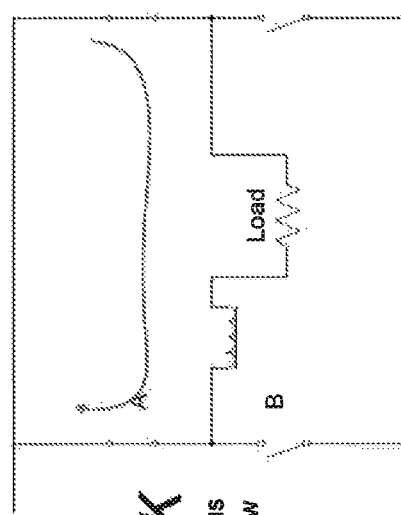
FIG. 4K
Synchronous
Current Flow
(a)
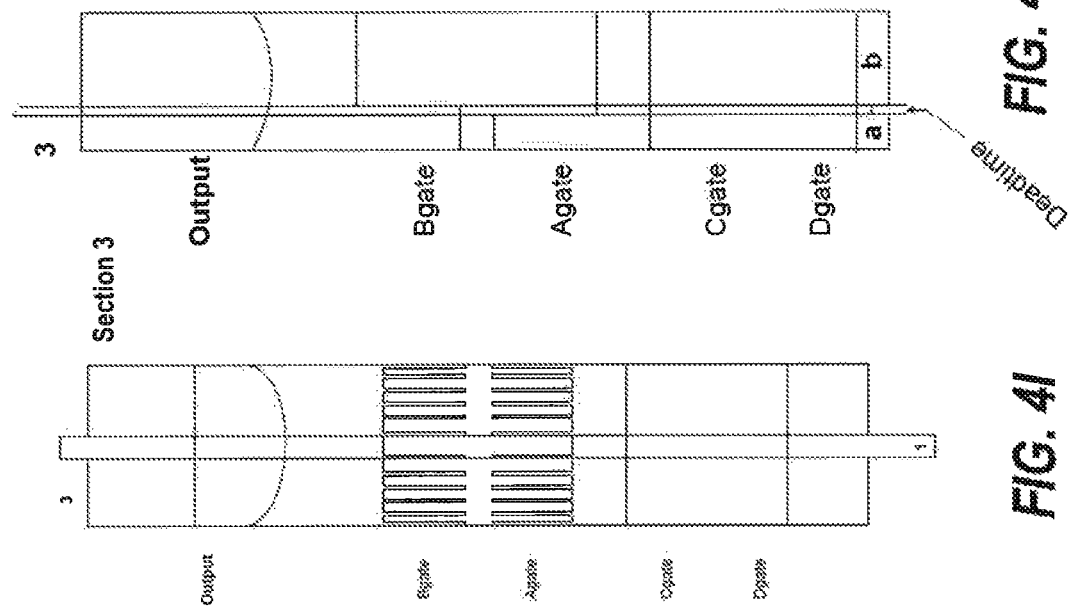
FIG. 4J
FIG. 4I

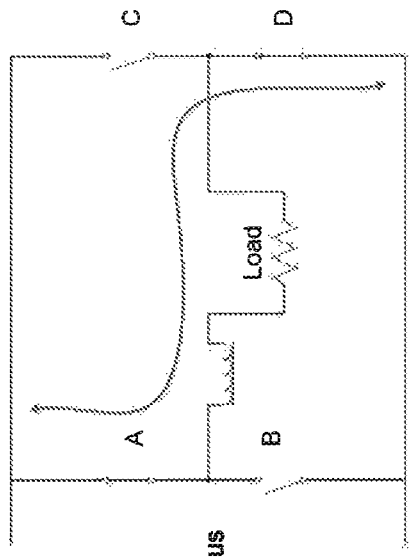
FIG. 4P
Buck/Synchronous
Current Flow
(b)
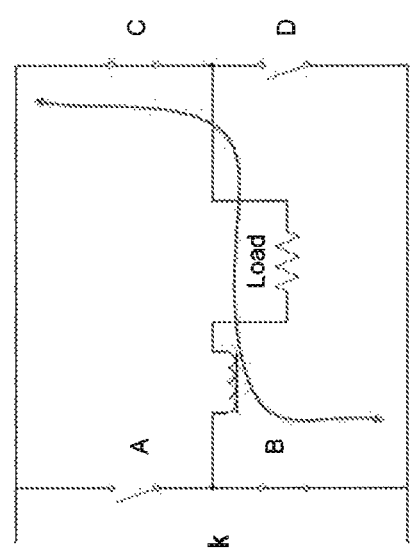
FIG. 4O
Synchronous/Buck
Current Flow
(a)
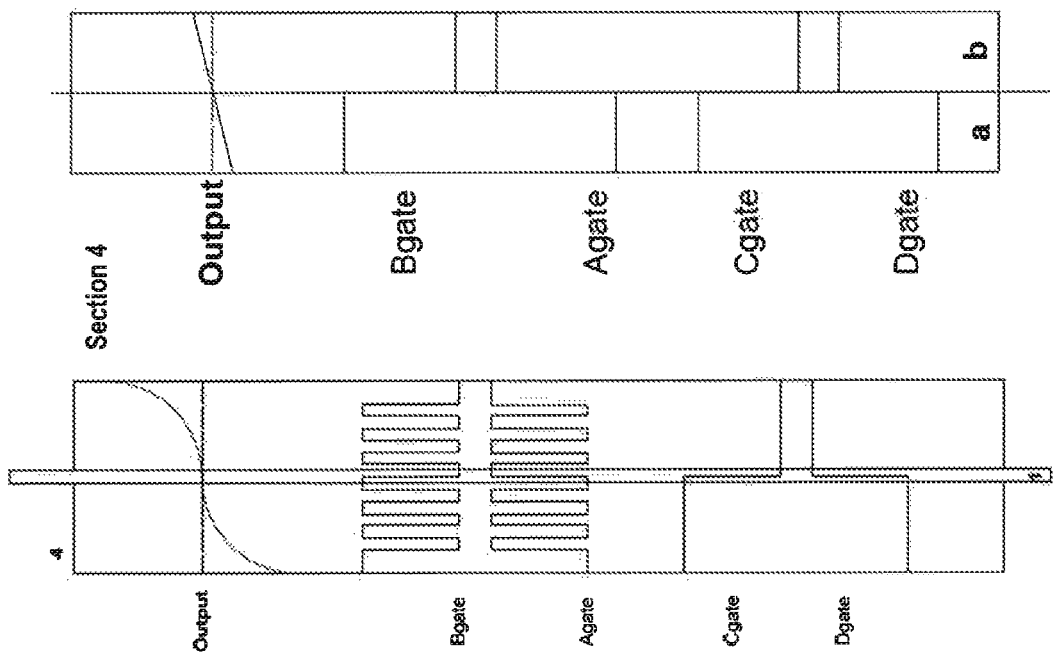
FIG. 4N
FIG. 4M

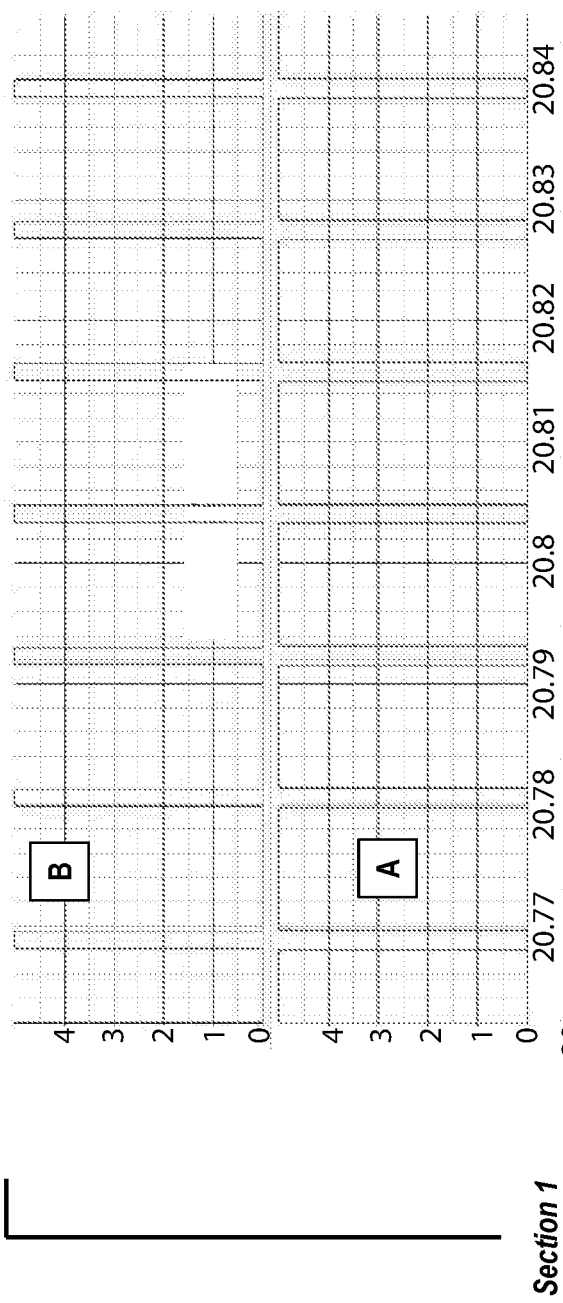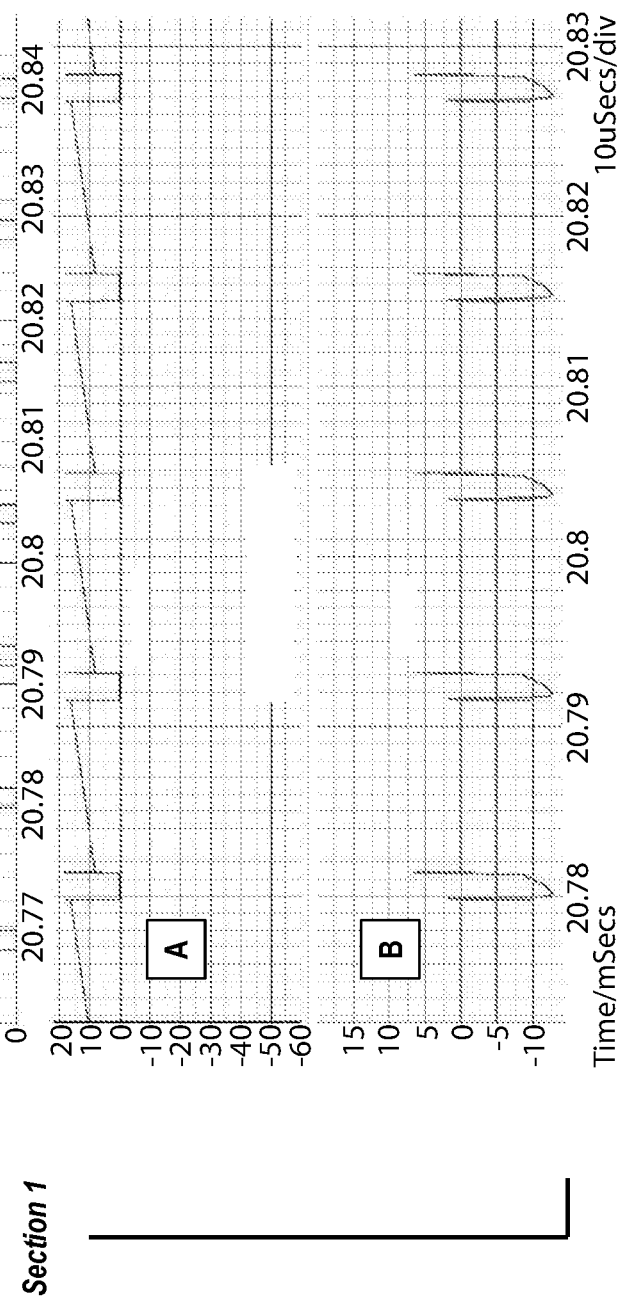
FIG. 5A
FIG. 5B
Section 1

Section 2

Section 3

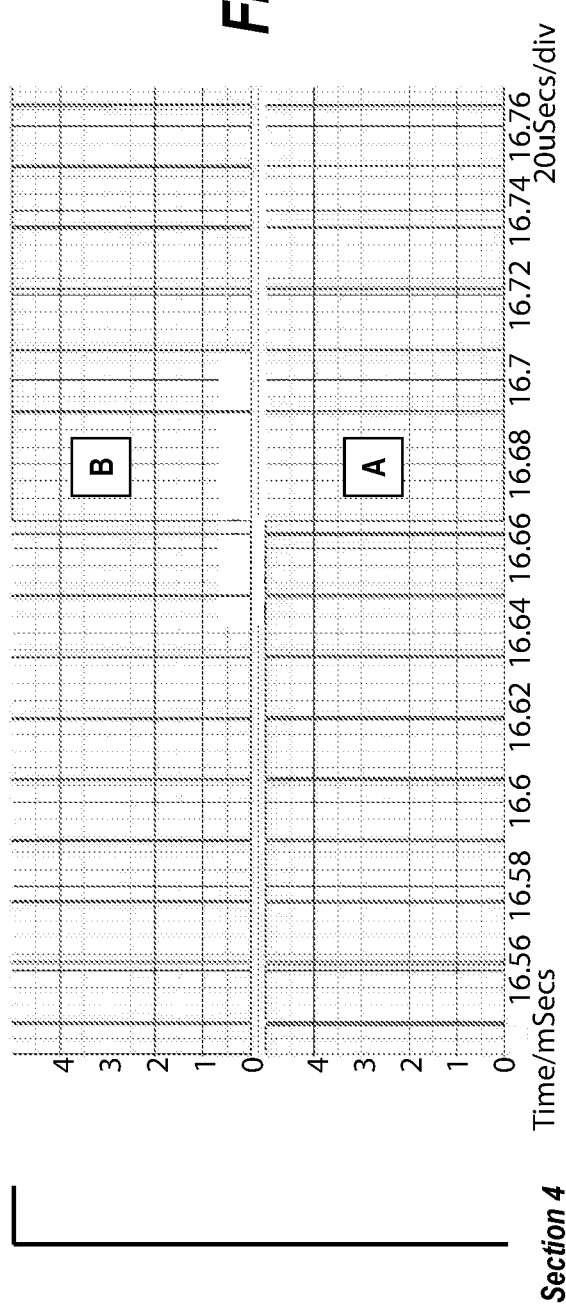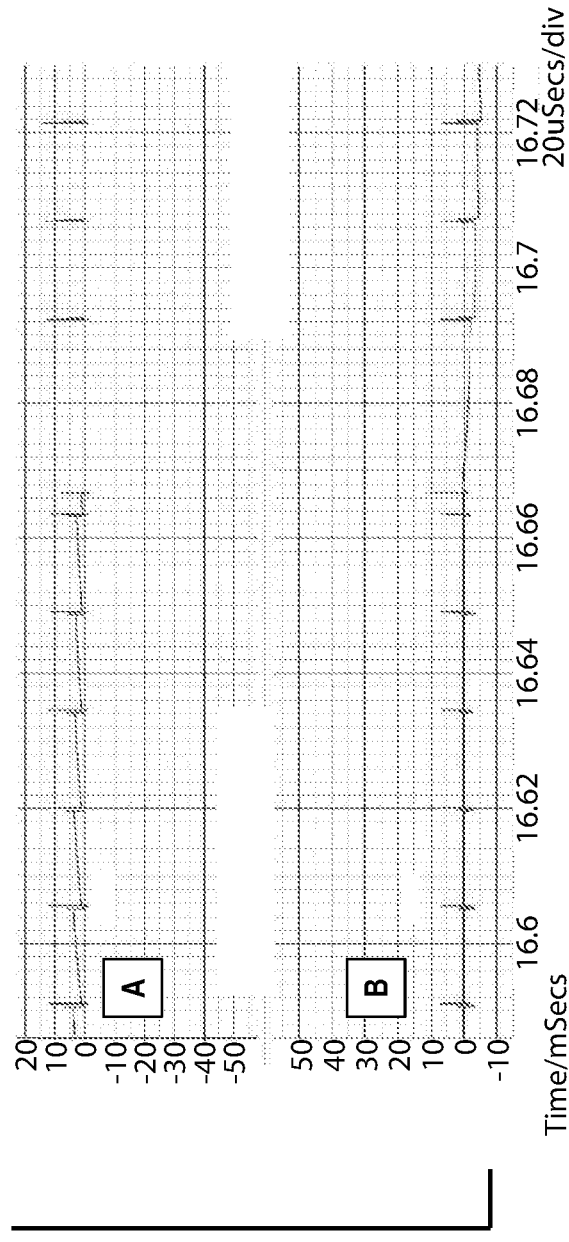
FIG. 8A
FIG. 8B
Section 4

| Switch | Positive Half Wave | Negative Half Wave |
|---|---|---|
| 1 | x | x' |
| 4 | x' | x |
| C | OFF | ON |
| D | ON | OFF | x = High Frequency PWM    x' = High Frequency PWM compliment

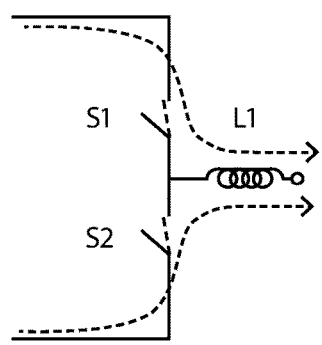
FIG. 23A
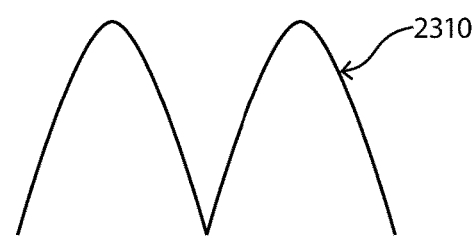
FIG. 23B
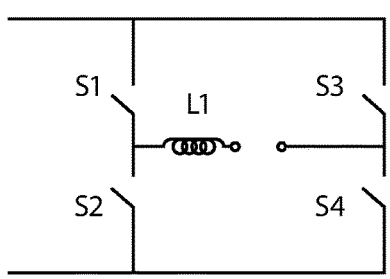
FIG. 24A
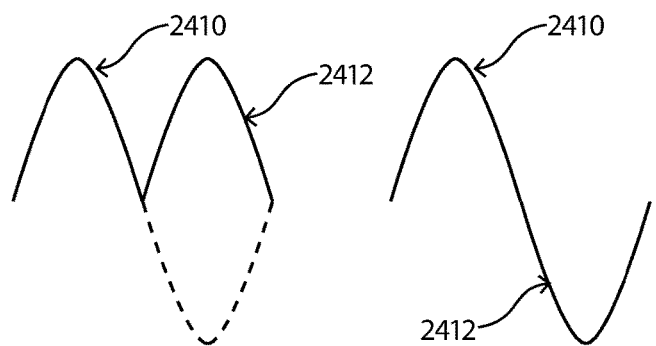
FIG. 24B
FIG. 24C

SYNCHRONOUS BUCK INVERTER

RELATED APPLICATIONS

This is a Continuation Application of Ser. No. 15/724,839 (now U.S. Pat. No. 10,840,824), filed Oct. 4, 2017, entitled "Synchronous Buck Inverter," which is a Continuation Application of Ser. No. 15/251,487 (now U.S. Pat. No. 9,935,580), filed Aug. 30, 2016, entitled "Wien Bridge Oscillator," which is a Continuation Application of application Ser. No. 14/675,073 (now U.S. Pat. No. 9,647,608), filed Mar. 31, 2015, entitled "Wien Bridge Oscillator," which claims priority to U.S. Provisional Patent Application No. 62/047,443, filed Sep. 8, 2014, entitled "Synchronous Buck Inverter," filed Sep. 8, 2014, the contents of which are incorporated by reference herein in their respective entireties herein.

FIELD OF THE DISCLOSURE

The present disclosure is directed to oscillators and power conversion. More specifically, the present disclosure relates to Wien bridge oscillators, such as for providing or simulating a pure sine wave for use in electrical applications, such as power applications, and to multi-stage switching for inverters, such as may utilize zero-cross discharge to reduce distortion and increase efficiency.

BACKGROUND

Certain power converters are configured to convert direct current (DC) to alternating current (AC). Such DC-AC converters are commonly referred to as inverters. Inverters have many industrial and commercial uses including, for example, converting DC power from a battery or photovoltaic source into AC power for a load. Inverters may also be used to supply AC power to an electric utility grid. A grid-tied inverter is a power inverter that converts direct current (DC) electricity into alternating current (AC) with an ability to synchronize to interface with a utility line. The applications for such an inverter include converting DC sources, such as solar panels or small wind turbines, into AC for tying with the grid. Photovoltaics (PV) in, for example, the aforementioned solar panels generate electrical power by converting solar radiation into direct current electricity using semiconductors that exhibit the photovoltaic effect.

Certain inverters are commonly configured to operate without a transformer. Examples of such inverters are disclosed in Salmi, et al., "Transformerless Microinverter for Photovoltaic Systems", pp. 639-650, vol. 3, issue 4, Int'l Journal of Energy and Environment (2012); Reddy et al., "Analysis and Modeling of Transformerless Photovoltaic Inverter Systems", pp. 2932-2938, vol. 3, issue 5, Intl Journal of Modern Engineering Research (2013); and Dreher et al., "Comparison of H-Bridge Single-Phase Transformerless PV String Inverters", 10th IEEE/IAS Int'l Conference on Industry Applications, pp. 1-8 (Nov. 2012).

Photovoltaic (PV) power supplied to a utility grid is increasing in popularity as the world's power demands are increasing. Solid-state inverters have been shown to be an important technology for coupling PV systems into the grid. Integration of PV power generation systems in the grid plays an important role in supplying electric power in an environmentally-friendly manner. A commonly-configured grid-connected PV system comprises of a PV panel, and a DC/AC Inverter that is operatively connected to the grid. This configuration is used for power generation in places or sites accessed by the electric utility grid. Depending on the application and requirements, a PV system can either be a stand-alone or hybrid system. Generally the PV system comprises of a PV generator which is a set of series-parallel electrically interconnected solar panels. PV panels are commonly rated in terms of a nominal peak power of the panel at standard test conditions (STC). A PV generator provides the total installed power, which is the sum of nominal peak power of each solar panel present in the PV installation. This PV generator is connected to an inverter which is, in turn, connected to an AC/DC load and/or grid.

Inverters are important components to grid-connected PV systems and their major role is to convert DC power into AC power. Furthermore, inverter interfacing PV module(s) with the grid ensures that the PV module(s) is operated at the maximum power point (MPPT). Based on the photovoltaic arrays' output voltage, output power level and applications, the photovoltaic grid-connected system may adopt different topologies. The grid-connected inverter may be designed for peak power and may obey conditions related to issues like power quality, detection of islanding operation, grounding, MPPT and long-life. Inverter maximum power is typically referred to the total installed power of the PV generator, and should optimize the energy injected to grid. Inverter PV topologies may include centralized inverters, string inverters, multi-string inverter and module inverters.

Although the foregoing discussion focuses particularly on PV systems, those skilled in the art will appreciate that issues that arise in PV systems similarly arise in other contexts that require power conversion/inversion, oscillation, and the like. Such contexts include, but are not limited to, sine wave generating inverters, micro-inverters, power supplies, and power distribution systems.

By way of example, conventional oscillator circuits are designed so that they will start oscillating ("start up") and that their respective amplitude will be controlled. For a linear circuit to oscillate, it must meet the "Barkhausen conditions," that is, the loop gain must be one and the phase around the loop must be an integer multiple of 360 degrees. In practice, the loop gain is initially larger than unity. Random noise is present in all circuits, and some of that noise will be near the desired frequency. A loop gain greater than one allows the amplitude of frequency to increase exponentially each time around the loop. With a loop gain greater than one, the oscillator will start. However, with a loop gain of greater than one, significant harmonic distortion is introduced, and the frequency stability of the oscillator may be affected.

A Wien bridge oscillator is a type of electronic oscillator that generates sine waves under a large range of frequencies. The Wien bridge oscillator is typically based on a bridge circuit comprising comprises four resistors and two capacitors (see FIG. 1). In use, the oscillator can operate as a positive gain amplifier combined with a band pass filter that provides positive feedback. In certain applications, such as power applications, Wien bridge oscillators may be used as inputs for circuit control and/or voltage reference (e.g., for power inverters). However, the quality of the sine wave produced by conventional Wien bridge oscillators is often subject to noise and distortion, and is not able to effectively simulate or approximate a true (or "pure") sine wave.

SUMMARY

Accordingly, an improved inverter topology is disclosed using high frequency switching control to generate a low frequency sine wave. The main switching may be realized using a synchronous-buck topology that is configured to invert every half cycle of a lower frequency. The inverting process may create a positive and negative transition true sine wave. The low frequency switching stage may be configured to operate as a true zero voltage switching (ZVS) and zero current switching (ZCS) drive.

The disclosed inverter may be further configured with an output capacitor, wherein the charge on the output capacitor may be discharged to zero upon every zero crossing of the low frequency switching stage. The benefit of this topology, as compared to a traditional synchronous buck inverter, is that the discharge of energy from the output storage capacitor every half cycle creates very low distortion. That is, during this discharge of energy, the zero crossing distortion in the low frequency sine wave is greatly reduced.

Comparisons will be made throughout to a full-bridge topology, currently deployed in a majority of grid-tied inverters presently, to the presently disclosed exemplary embodiments to demonstrate advantageous improvements in efficiency, load variation and total harmonic distortion.

Further, in some illustrative embodiments, an oscillator circuit is disclosed, comprising a Wien bridge oscillator circuit, a full-wave rectifier circuit, coupled to an output of the Wien bridge oscillator circuit, an integrator circuit, coupled to an output of the full-wave rectifier circuit, and a multiplier circuit, comprising a first input coupled to the output of the Wien bridge oscillator circuit, and a second input, coupled to an output of the integrator, the multiple signal configured to provide a signal to an input of the Wien bridge oscillator circuit.

In some illustrative embodiments, the oscillator circuit may further comprise a RC circuit, coupled between the output of the full-wave rectifier circuit and the integrator circuit. In some illustrative embodiments, the multiplier circuit comprises an XY multiplier, and the XY multiplier is coupled to an inverting amplifier input of the Wien bridge oscillator circuit. Additionally, in some illustrative embodiments, the multiplier circuit is configured to execute a transfer function on voltage received at the first input and the second input, while the full wave rectifier is configured to execute a different transfer function on the voltage received at an input.

In some illustrative embodiments, the multiplier circuit may be configured to dynamically control gain in the Wien bridge oscillator circuit. An output of the integrator circuit is coupled to a synchronous buck circuit. The integrator circuit may be configured to provide a sinusoidal reference signal to the synchronous buck circuit.

BRIEF DESCRIPTION OF THE FIGURES

The present disclosure will become more fully understood from the detailed description given herein below and the accompanying drawings which are given by way of illustration only, and which thus do not limit the present disclosure, and wherein:

FIG. 4 illustrates a switch sequence diagram that includes four switching sections over the course of an exemplary sine wave for switches A-D of the embodiments of FIGS. 3A and 3C;

FIGS. 4A-B illustrate an exemplary switching transitions of switches A-D of the embodiment of FIG. 3A during a first switching section (at peak of positive sine wave) of FIG. 4;

FIG. 4C schematically illustrates a synchronous current flow through a load and a switching configuration for switches A-D for time period (a) of FIG. 4B under one exemplary embodiment;

FIG. 4D schematically illustrates a buck current flow through a load and a switching configuration for switches A-D for time period (b) of FIG. 4B under one exemplary embodiment;

FIGS. 4E-F illustrate an exemplary switching transitions of switches A-D of the embodiment of FIG. 3A during a second switching section (at positive-negative zero crossing transition of sine wave) of FIG. 4;

FIG. 4G schematically illustrates a buck/synchronous current flow through a load and a switching configuration for switches A-D for time period (a) of FIG. 4F under one exemplary embodiment;

FIG. 4H schematically illustrates a synchronous/buck current flow through a load and a switching configuration for switches A-D for time period (b) of FIG. 4F under one exemplary embodiment;

FIGS. 4I-J illustrate an exemplary switching transitions of switches A-D of the embodiment of FIG. 3A during a third switching section (at peak negative of sine wave) of FIG. 4;

FIG. 4K schematically illustrates a synchronous current flow through a load and a switching configuration for switches A-D for time period (a) of FIG. 4J under one exemplary embodiment;

FIG. 4L schematically illustrates a buck current flow through a load and a switching configuration for switches A-D for time period (b) of FIG. 4J under one exemplary embodiment;

FIGS. 4M-N illustrate an exemplary switching transitions of switches A-D of the embodiment of FIG. 3A during a fourth switching section (at negative-positive zero crossing transition of sine wave) of FIG. 4;

FIG. 4O schematically illustrates a synchronous/buck current flow through a load and a switching configuration for switches A-D for time period (a) of FIG. 4N under one exemplary embodiment;

FIG. 4P schematically illustrates a buck/synchronous current flow through a load and a switching configuration for switches A-D for time period (b) of FIG. 4N under one exemplary embodiment;

FIGS. 5A-B illustrate an exemplary gate drive waveform and current waveform for a positive signal condition for switches A and B for the first switching section illustrated in the exemplary embodiments of FIG. 4A-D above;

FIGS. 8A-B illustrate an exemplary gate drive waveform and current waveform for a zero crossing signal condition for switches A and B for the fourth switching section illustrated in the exemplary embodiments of FIG. 4M-P above;

FIG. 23A shows a simplified circuit for operating synchronous high frequency switches to cause current to flow across an inductor under an illustrative embodiment;

FIG. 23B illustrates a simulated waveform of a rectified sinusoid produced by the simplified circuit of FIG. 13A under an embodiment;

FIG. 24A shows a simplified circuit comprising low frequency switches added to the circuit of FIG. 23A.

FIG. 24B illustrates a simulated waveform of a rectified sinusoid in which a portion of the rectified sinusoid is to be inverted using the simplified circuit of FIG. 24A;

FIG. 24C illustrates a simulated waveform of a rectified sinusoid in which a portion of the rectified sinusoid is inverted using the simplified circuit of FIG. 24A.

DETAILED DESCRIPTION

Figures 1A, 1B:
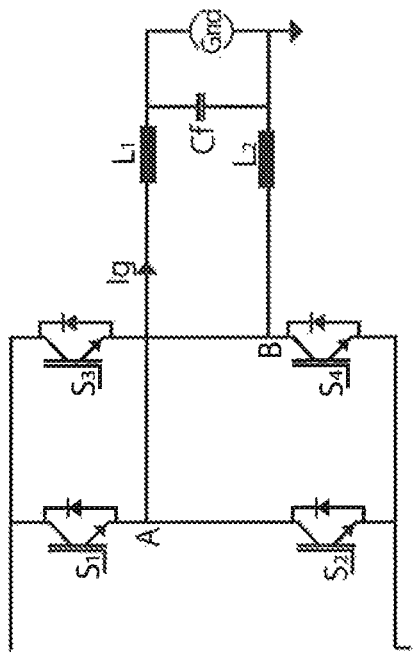
FIG. 1A illustrates an exemplary full bridge inverter topology that is known in the art.
FIG. 1B illustrates a switching sequence for switches $S_1$-$S_4$ of FIG. 1A under a positive half wave and negative half wave condition.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Turning now to FIG. 1A, a conventional inverter is illustrated and will be used for reference for the embodiments discussed throughout, such as in connection with the discussion of FIGS. 3A-10B. It should be understood by those skilled in the art that the specific configuration in FIG. 1A is merely used for illustrative purposes and is not intended to limit the present disclosure.

The inverter of FIG. 1A is configured as a full-bridge inverter topology and comprises of four switches, two output inductors and an output storage capacitor. In this case, L2 may be the same as L1 and the total common-mode voltage $V_{cm}$ is ½ $V_{DC}$. Conventionally, the full-bridge uses one of two control strategies. For the bipolar PWM control strategy, one group of diagonal switches operates at a switching frequency complementary to the other group of switches. As a result, the inverter output voltage has only two levels which results in high current ripple across the output inductors. An exemplary switching sequence for the circuit of FIG. 1A is shown where, for a sine wave input, switches $S_1$ and $S_4$ are closed, while switches $S_2$ and $S_3$ are open on the positive half wave of the input. Conversely, switches $S_1$ and $S_4$ are open, while switches $S_2$ and $S_3$ are closed on the negative half wave of the input.

The major drawback of employing the full-bridge with, for example, bipolar PWM is the high power losses due to two factors. The first factor is the internal reactive power flow inside the inverter, and the second is the double switching frequency required to obtain the same inductor current ripple frequency. The second control strategy that may be applied to the full-bridge of FIG. 1A is the unipolar PWM. In such modulation, the inverter output voltage has three levels, which decreases significantly the current ripple across the inductors. With this modulation, the inverter has high efficiency due to the absence of the internal reactive power flow. However, with this control strategy, the inverter generates high leakage current level.

Accordingly, other topologies have endeavored to combine the advantages of the bipolar PWM (low leakage current level) and those of the unipolar PWM (High efficiency, low current ripple and three level inverter output voltages). These endeavors have been undertaken by adding extra switches to the full-bridge topology. These extra switches disconnect the PV array from the grid during the freewheeling periods. Nevertheless, these and like circuits such as that illustrated in FIG. 1A carry excessive harmonic distortions in the signal, and thus operate at a reduced efficiency.

Figure 2A:
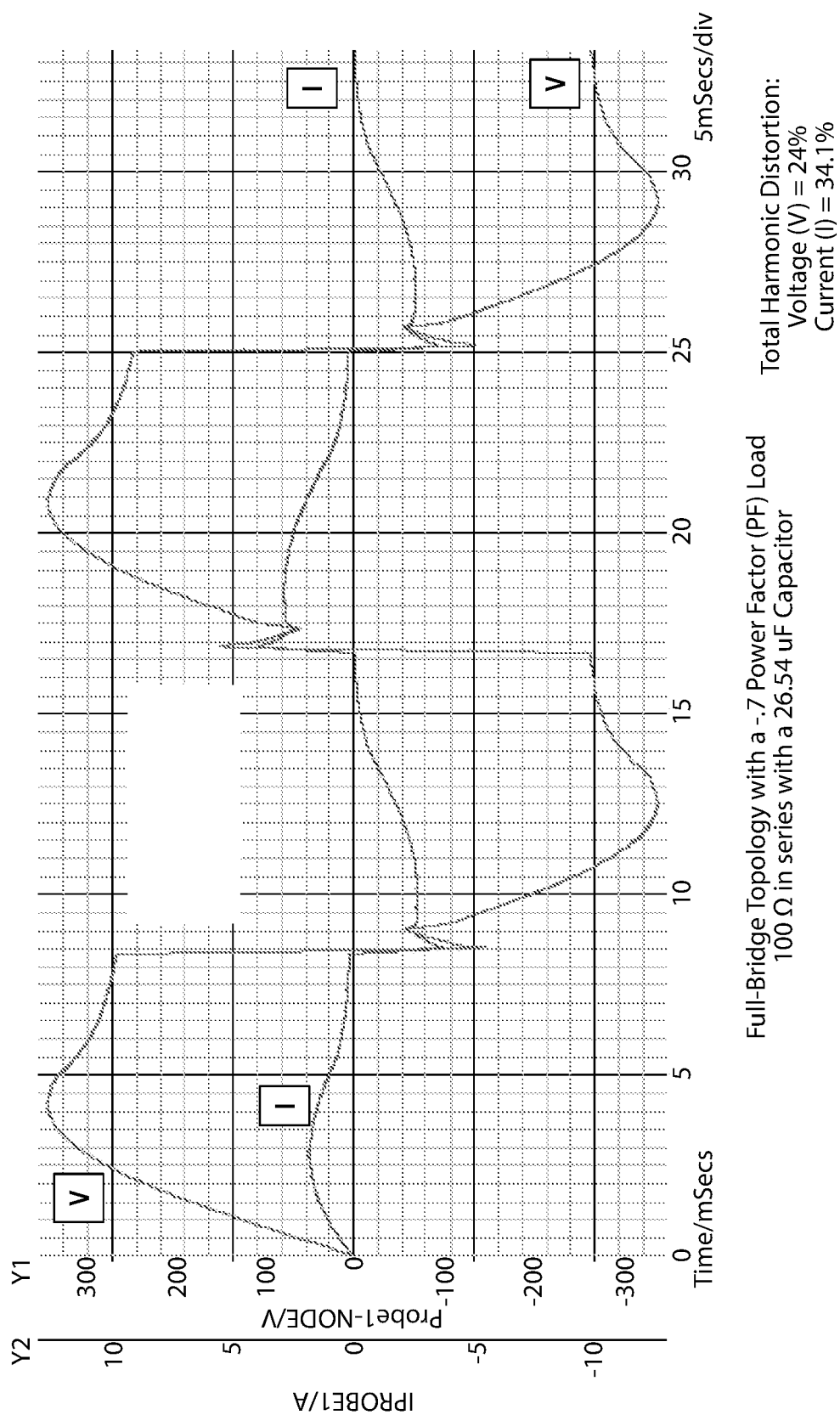
FIGS. 2A-2E illustrate waveforms exemplifying typical operational conditions for the example of FIG. 1A.
Figure 2B:
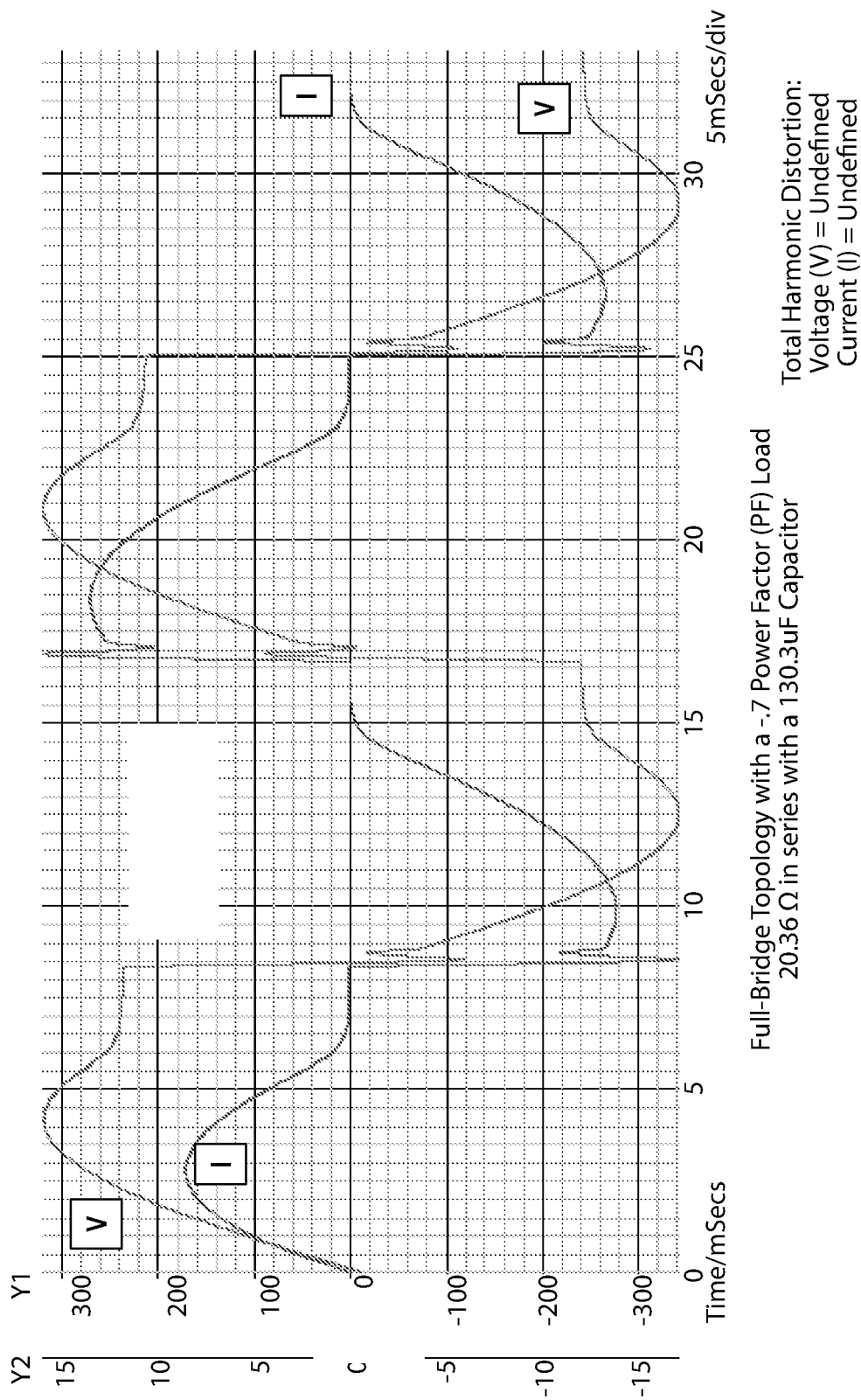

FIG. 2A is an exemplary simulated waveform for the circuit of FIG. 1A, operating under a −0.7 power factor (PF) load, utilizing 100Ω in series with a 26.54 μF capacitor. As can be determined from the voltage (V) and current (I) waveforms, voltage distortion is approximately 24%, while current distortion is approximately 34.1%. As will be appreciated by those skilled in the art, the distortion is particularly acute around the zero crossing phases. As the resistance is reduced to 20.63Ω in series with a 130.3 μF capacitor, the total harmonic distortion increases to a point that it could not be measured, as illustrated in FIG. 2B.

Figure 2C:
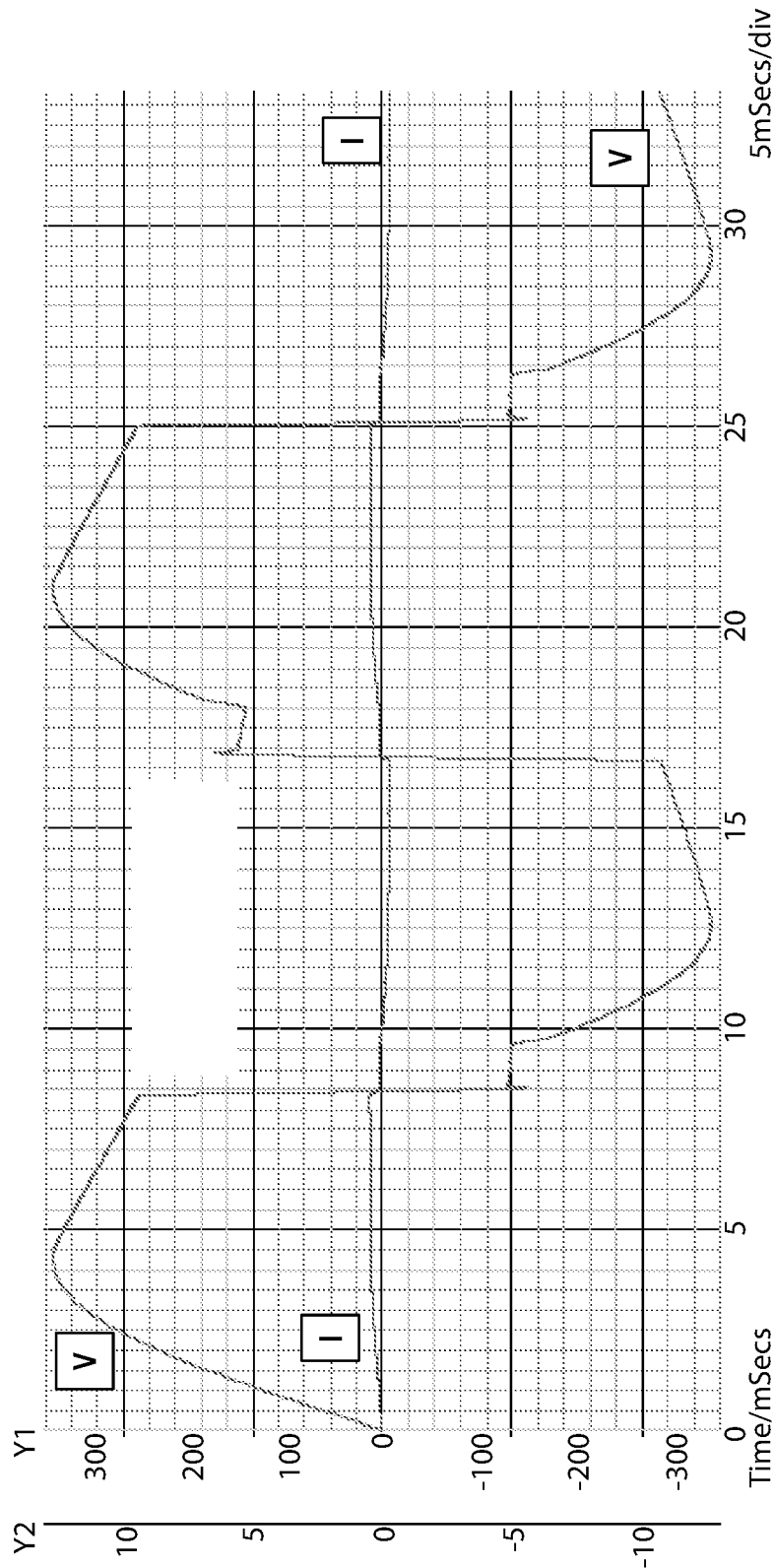
Figure 2D:
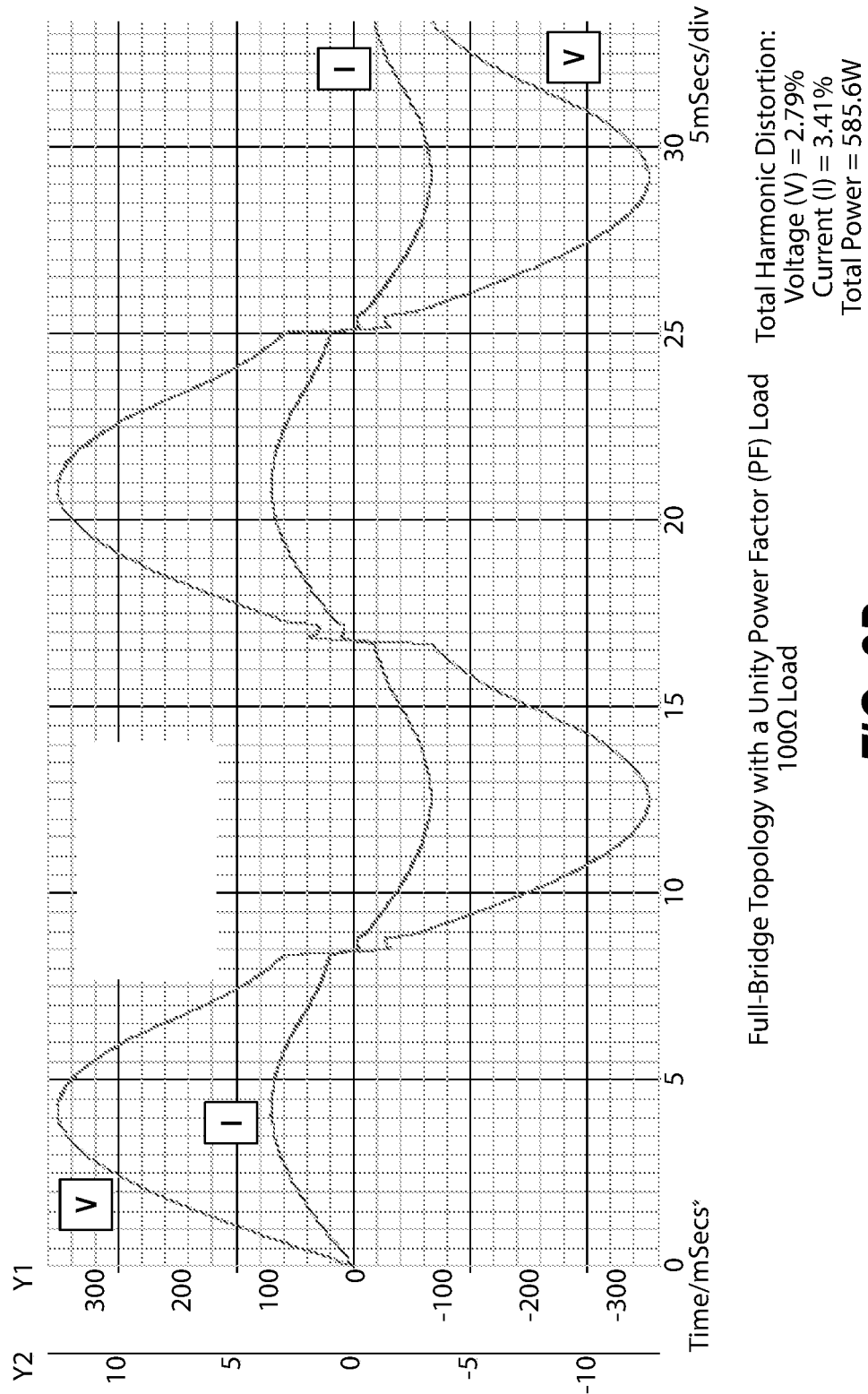
Figure 2E:
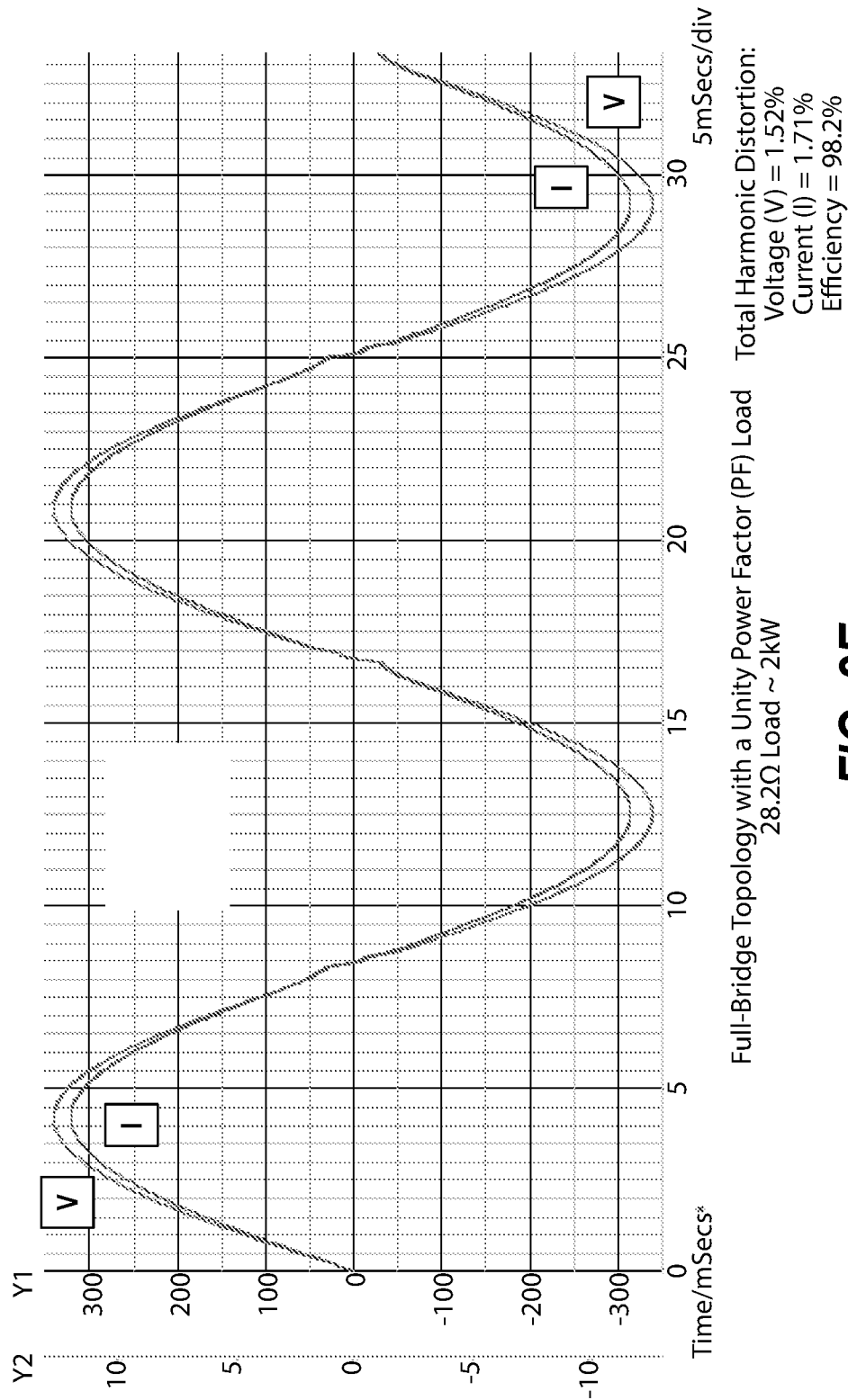

In FIG. 2C, utilizing a unity power factor load of 1 kΩ for the circuit of FIG. 1A, the total harmonic distortion measured for the voltage (V) in the simulated waveform is 26.9%, and 25.1% for the current (I). Utilizing a unity power factor with a reduced load of 100Ω for the circuit of FIG. 1A, the total harmonic distortion measured for the voltage (V) is 2.79%, and 3.41% for the current (I), with a total power of 585.6 W as illustrated in the simulated waveform of FIG. 2D. In FIG. 2E, utilizing a unity power factor load of 28.2Ω at approximately 2 kW, total harmonic distortion measured for the voltage (V) was 1.52%, and 1.71% for the current (I), with an efficiency of 98.2%.

Buck converters, and particularly synchronous buck converters, may advantageously be configured for inverter applications to provide less noisy and more efficient power output. The use of conventional buck converters for inverters is known in the art, and examples of such applications may be found in U.S. Pat. No. 8,488,350 to Sigamani, titled "DC-AC Inverters", issued Jul. 16, 2013, and U.S. Pat. No. 7,872,887 to Nishio et al., titled "DC-AC Inverter Powering a Single Phase Commercial Power System", issued Jan. 18, 2011, both of which are incorporated by reference in their entirety herein. While the aforementioned configurations provide some improvement over conventional inverter topologies, further improvements may be realized utilizing configurations disclosed herein.

Figures 3A, 3B:
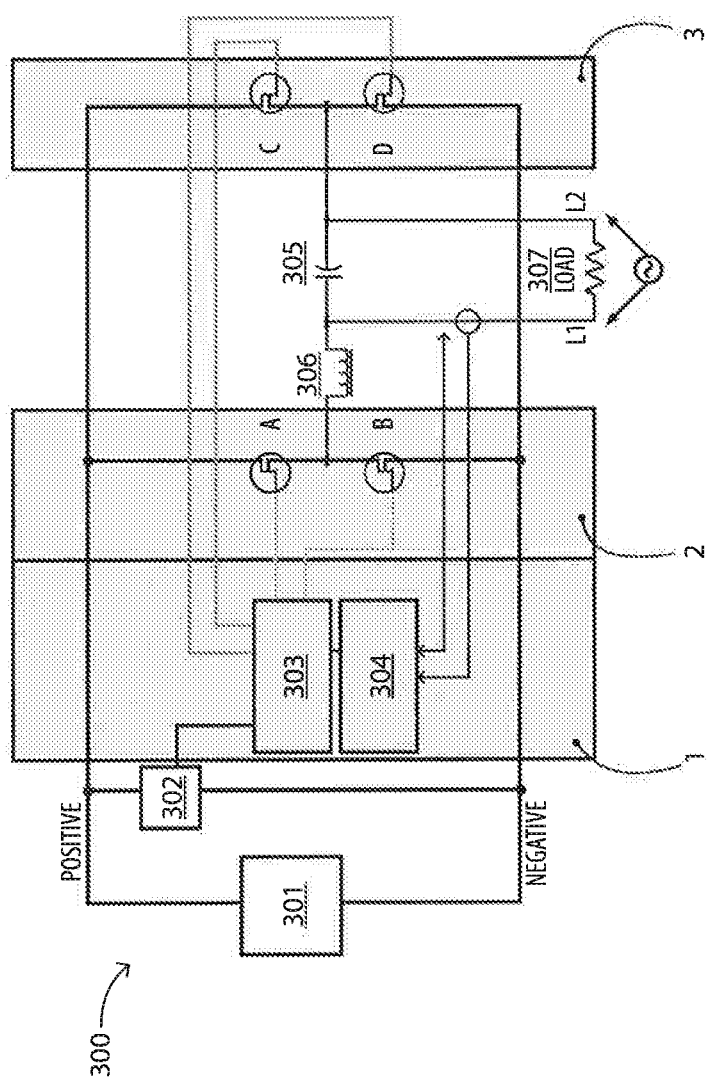
FIG. 3A illustrates an exemplary synchronous buck inverter topology under one exemplary embodiment, where the inverter comprises a high-frequency switching portion, a synchronous buck portion and a low frequency switching stage coupled to a discharge capacitor configured to be coupled to a load.
FIG. 3B illustrates a switching sequence for switches A-D of the embodiment of FIG. 3A under positive half wave and negative half wave conditions.

Turning now to FIG. 3A, synchronous buck inverter topology 300 is disclosed in an exemplary embodiment. Inverter 300 comprises a DC source 301 and a house supply 302 for providing positive and negative voltages to high frequency switches A-B and low frequency switches C-D, as shown. In an embodiment, switches A-D are comprised of high frequency switches, such as field effect transistors (FETs). It should be understood by those skilled in the art that other switches or suitable switching mechanisms may be employed, depending on the specific application of the inverter. Inverter 300 may comprise a high frequency switching control (1) comprising controller 303 and sensing circuit 304.

Figure 3C:
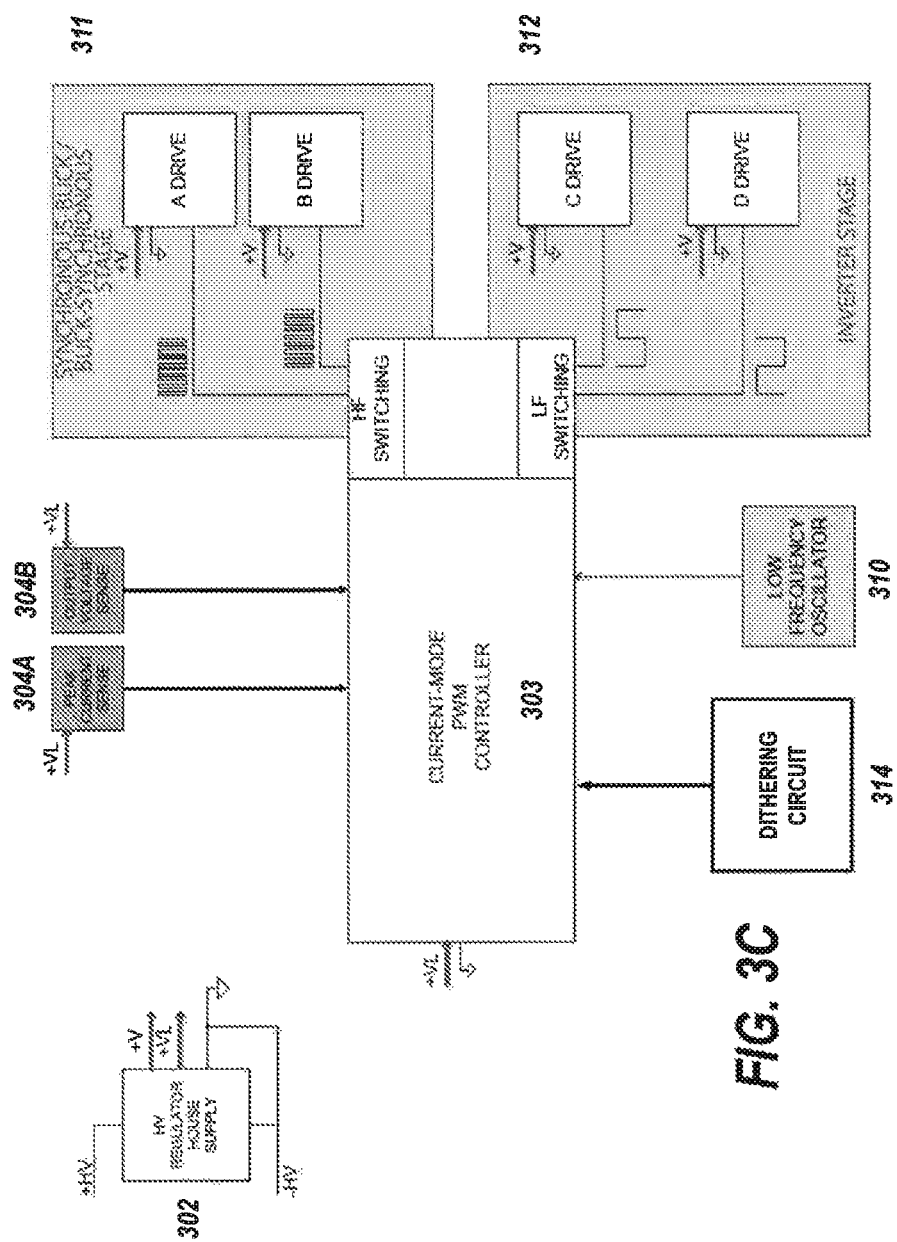
FIG. 3C provides another illustration of a synchronous buck inverter under another embodiment.

In an embodiment, controller may comprise a current-mode PWM controller (see FIG. 3C) and sensing circuit 304 comprises a peak current sense and an output voltage sense (see refs. 304A-B of FIG. 3C). Controller 303 may be operatively coupled to a gate of each of switches A-D, while sensing circuit 304 may be coupled to a load line as is shown illustratively in FIG. 3A. Alternatively, controller may be a microprocessor running firmware to control switches A-D.

Controller 303 may be configured to provide a low frequency sine wave (or other suitable signal) to effect switching control on the synchronous-buck portion of inverter 300. Main switching may be realized using synchronous-buck switching portion (2), comprising switches A and B, to invert every half cycle of the frequency of the signal provided by controller 303. The inverting process thus creates a positive and negative transition of the sine wave signal. Low frequency switching stage (3) comprises switches C and D and may be configured to operate as zero voltage switching (ZVS) and zero current switching (ZCS) drives Notably, using the configuration of FIG. 3A, the charge on output capacitor 305 is discharged to zero on every zero crossing of low frequency switching stage (3). Compared to a conventional synchronous buck, the configuration of FIG. 3A advantageously discharges energy every half cycle. During this discharge of energy, the zero crossing distortion in the low frequency sine wave is greatly reduced.

Turning now to FIG. 3B, an exemplary switching sequence is illustrated wherein switches A and B of the synchronous-buck switching portion (2) simultaneously and alternately provide high frequency PWM (x) and high frequency PWM complement (x') for each positive half wave and negative half wave. Switches C and D for the low frequency switching stage (3) are configured such that switch C is OFF for each positive half wave and ON for each negative half wave, while switch D is ON for each positive half wave and OFF for each negative half wave.

FIG. 3C is another exemplary embodiment of a synchronous buck inverter, similar to inverter 300, wherein high voltage regulator house supply 302 receives input power (+HV, −HV) from a source (e.g., 301) and produces output voltage +V for each of the switch drives (A-D Drive) and voltage +VL for current-mode PWM controller 303, peak current sense 304A and output voltage sense 304B. Controller 303 may provide low frequency signals (e.g., sine wave) via low frequency oscillator 310. Controller 303 as illustrated in the embodiment of FIG. 3C may comprise a high frequency (HF) switching portion and low frequency (LF) switching portion, wherein HF switching portion activates/deactivates switches associated with A DRIVE and B DRIVE of synchronous-buck/buck-synchronous stage 311 (see section (2) of FIG. 3A). LF switching portion may activate/deactivate switches associated with C DRIVE and D DRIVE of inverter stage 312 (see section (3) of FIG. 3A).

Turning now to FIG. 4, an exemplary switch sequence diagram for the embodiment of FIG. 3A is provided for one cycle of controller output (Output) illustrated as a sine wave in the figure. As can be seen, high frequency outputs for switches A and B ($A_{gate}$, $B_{gate}$) are shown together with low frequency outputs for switches C and D ($C_{gate}$, $D_{gate}$), together with an inverted half-cycle voltage output (Ref). In the exemplary embodiment of FIG. 4, the cycle is separated into four sections (1-4) to better describe exemplary operation of the circuit, which is provided below.

FIGS. 4A-B are exemplary illustrations of a first section (Section 1) during a positive peak condition (Output) in the circuit, where it can be seen that $A_{gate}$ and $B_{gate}$ provide a high frequency PWM and high frequency PWM complement for the positive peak. During switching time (a), output voltage is at a positive peak condition for the sine wave, where $A_{gate}$ drive is low, $B_{gate}$ drive is high, $C_{gate}$ drive is low and $D_{gate}$ drive is high. As switches A and C are open, the inductor current conducts from the B switch to the D switch via inductor 306 and load 307 in synchronous current flow as shown in FIG. 4C. During the (b) switching time, the output is still at a positive peak condition and the $A_{gate}$ drive goes high, $B_{gate}$ goes low, $C_{gate}$ drive is low and $D_{gate}$ drive is high. As switch A opens and switch B closes, inductor current conducts from the A switch to the D switch as buck current flow as shown in FIG. 4D.

FIGS. 4E-F are exemplary illustrations of a second section (Section 2) during a first zero crossing (Output) positive to negative transition in the circuit. During switching time (a), output voltage is at a zero crossing condition (from positive peak to negative peak) for the sine wave, where $A_{gate}$ drive is high, $B_{gate}$ drive is low, $C_{gate}$ drive is low and $D_{gate}$ drive is high. As switches B and C are open, the inductor current instantaneously switches directions and conducts from the A switch to the D switch via inductor 306 and load 307 in buck/synchronous current flow as shown in FIG. 4G. During the (b) switching time, the output crosses from the positive peak to the negative peak of the sine wave, causing the $A_{gate}$ drive to go low, $B_{gate}$ to go high, $C_{gate}$ to go high and $D_{gate}$ gate to go low. As switches B and C open and switches A and D close, inductor current instantaneously switches directions and conducts from the B switch to the C switch as synchronous/buck current flow as shown in FIG. 4H.

FIGS. 4I-J are exemplary illustrations of a third section (Section 3) during a negative peak condition (Output) in the circuit, where it can be seen that $A_{gate}$ and $B_{gate}$ provide a high frequency PWM and high frequency PWM complement for the negative peak. During switching time (a), output voltage is at a negative peak condition for the sine wave, where $A_{gate}$ drive is high, $B_{gate}$ drive is low, $C_{gate}$ drive is high and $D_{gate}$ drive is low. As switches B and D are open, the inductor current conducts from the C switch to the A switch in synchronous current flow as shown in FIG. 4K. During the (b) switching time, the output moves away from the negative peak condition and the $A_{gate}$ drive goes low, $B_{gate}$ goes high, $C_{gate}$ drive is high and $D_{gate}$ drive is low. As switch A opens and switch B closes, inductor current conducts from the C switch to the B switch as buck current flow as shown in FIG. 4L.

FIGS. 4M-N are exemplary illustrations of a fourth section (Section 4) during a second zero crossing (Output) negative to positive transition in the circuit. During switching time (a), output voltage is approaching a zero crossing condition (from negative peak to positive peak) for the sine wave, where $A_{gate}$ drive is low, $B_{gate}$ drive is high, $C_{gate}$ drive is high and $D_{gate}$ drive is low. As switches A and D are open at zero crossing, the inductor current instantaneously switches directions from the B switch to the D switch in synchronous/buck current flow as shown in FIG. 4O. During the (b) switching time, the output crosses from the negative peak to the positive peak of the sine wave, causing the $A_{gate}$ drive to go high, $B_{gate}$ to go low, $C_{gate}$ to go low and $D_{gate}$ gate to go high. As switches B and C open and switches A and D close, inductor current instantaneously switches directions from the A switch to the D switch in buck/synchronous current flow as shown in FIG. 4P.

Exemplary simulated gate drive waveforms and current waveforms for synchronous-buck circuit portion (2) of inverter 300, comprising switches A and B, are illustrated in FIGS. 5A-7B. The exemplary simulated waveforms of FIGS. 5A and 5B illustrate switching gate drive waveforms and current waveforms during a positive peak condition, discussed above in connection with FIGS. 4A-D. As can be seen from the simulated current drive waveform of FIG. 5B, switch A, operating as a buck switch, goes low as switch B, operating as a synchronous switch, goes high during PWM switching. In the simulated current waveform of FIG. 5B, it can be seen that when switch A is open, current conducts from the B switch (to the D switch) as discussed above in connection with FIG. 4C. As switch A opens and switch B closes current conducts from the A switch (to the D switch) as discussed above in connection with FIGS. 4C-D.

Figure 6A:
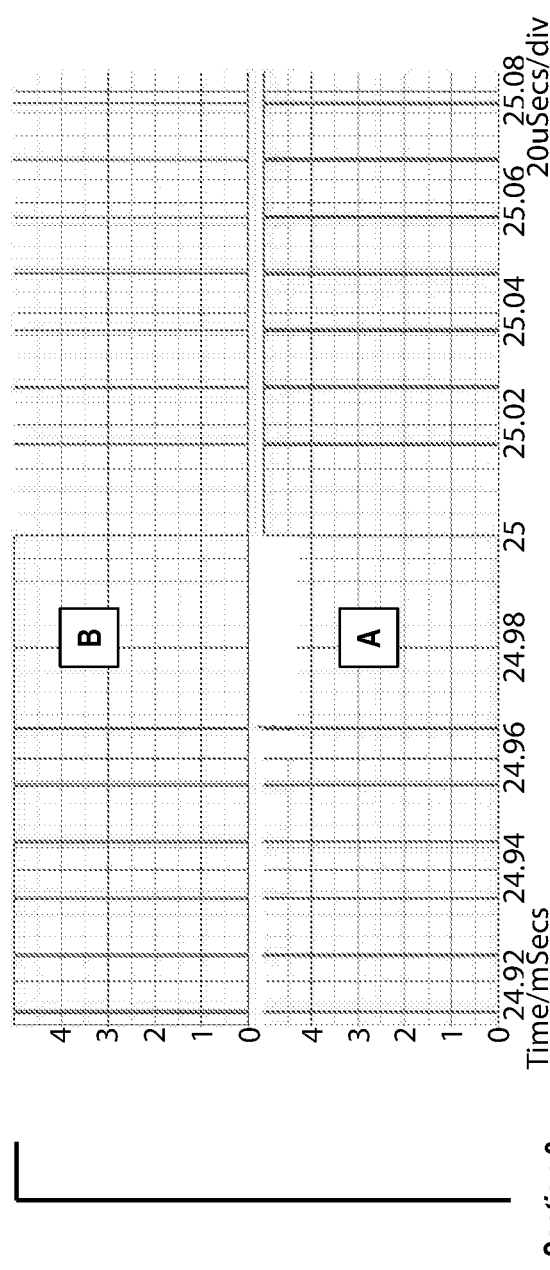
FIGS. 6A-B illustrate an exemplary gate drive waveform and current waveform for a zero crossing condition for switches A and B for the second switching section illustrated in the exemplary embodiments of FIG. 4E-G above.
Figure 6B:
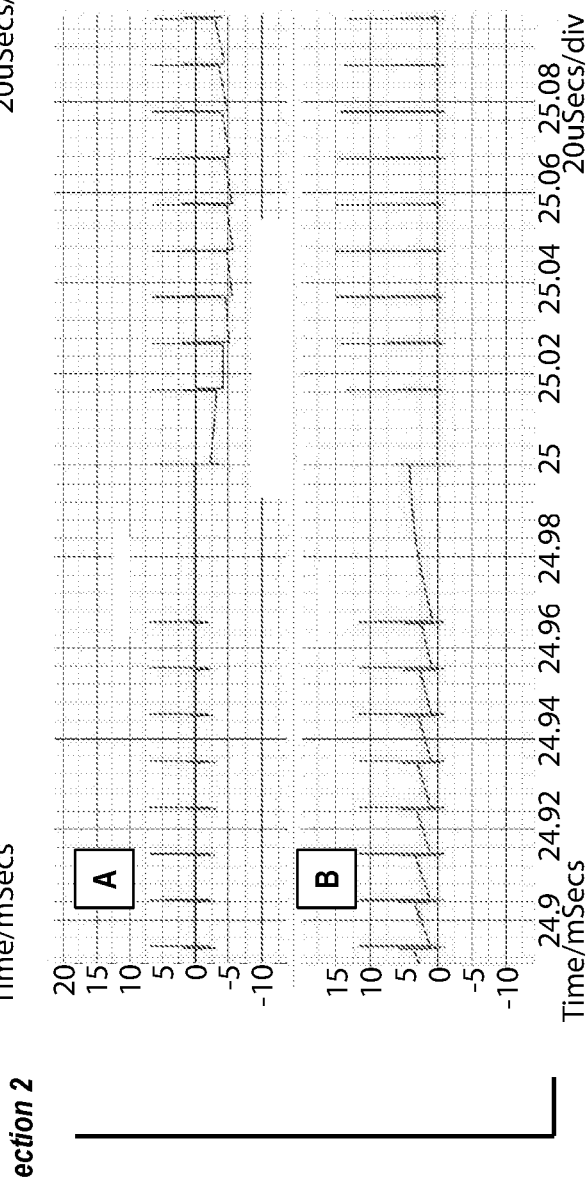

The exemplary simulated waveforms of FIGS. 6A and 6B illustrate switching gate drive waveforms and current waveforms during a first zero crossing condition (i.e., from positive to negative peak), discussed above in connection with FIGS. 4E-H. As can be seen from the simulated current drive waveform of FIG. 6B, switch A operates as a buck switch before the zero crossing, and switch B operates as a buck switch after the zero crossing. As switch B opens, current instantaneously switches directions and conducts from the A switch (to the D switch). After the zero crossing (from the positive peak to the negative peak), switch B opens and switch A closes causing current to instantaneously switch directions and conducts from the B switch (to the C switch) as discussed above in connection with FIGS. G-H.

Figure 7A:
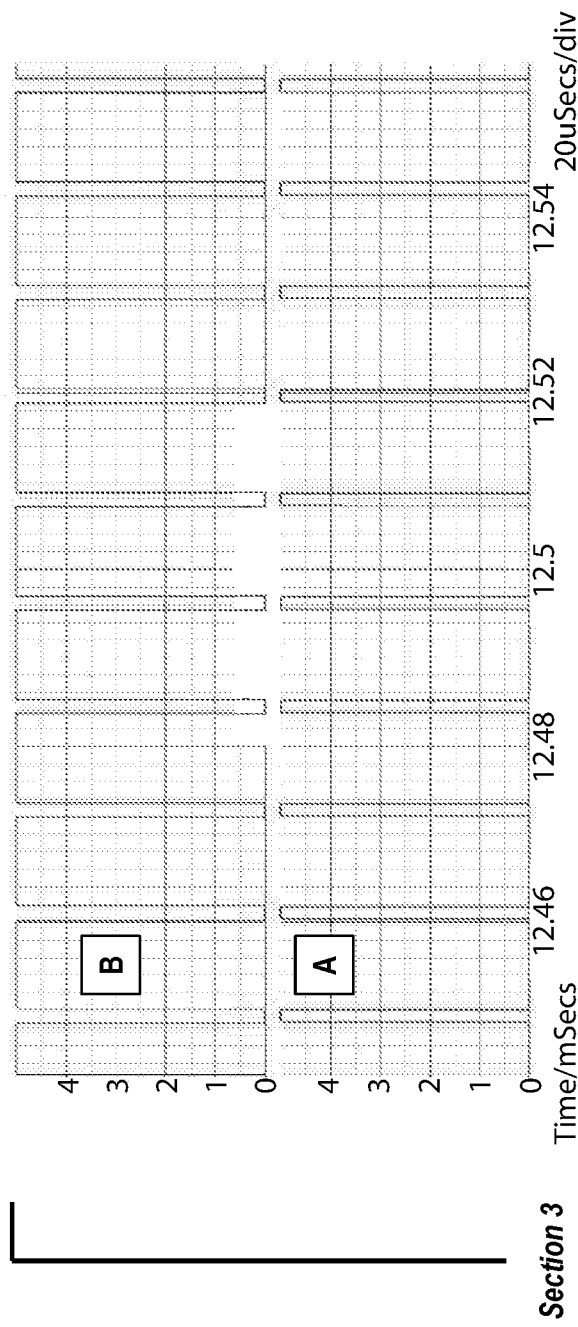
FIGS. 7A-B illustrate an exemplary gate drive waveform and current waveform for a negative signal condition for switches A and B for the third switching section illustrated in the exemplary embodiments of FIG. 4I-L above.
Figure 7B:
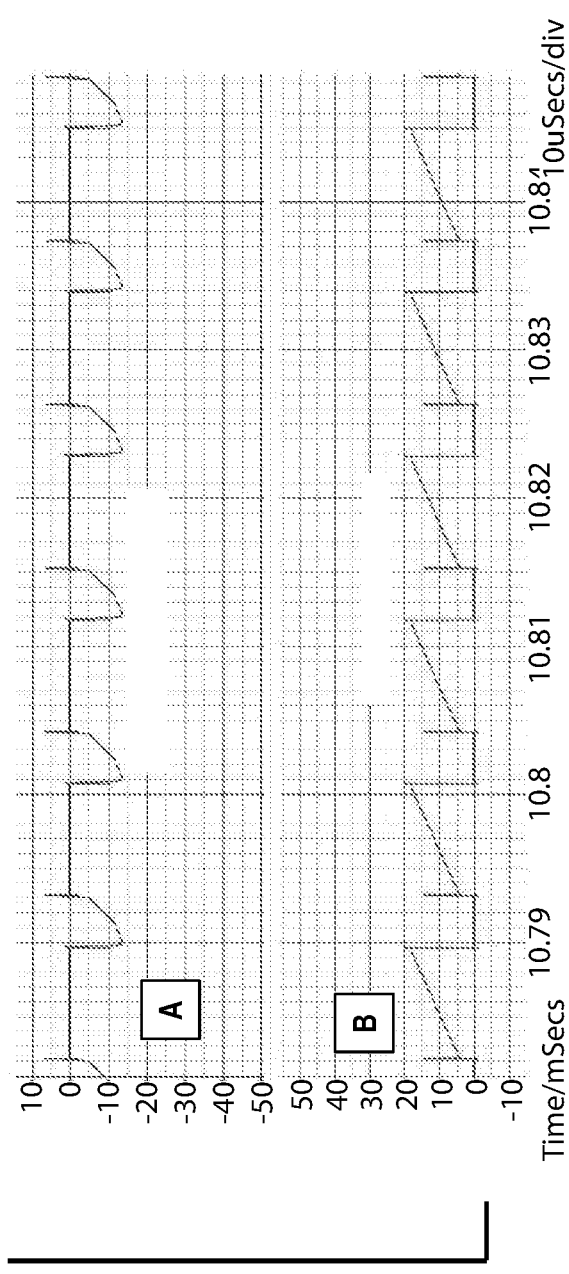

The exemplary simulated waveforms of FIGS. 7A and 7B illustrate switching gate drive waveforms and current waveforms during a negative peak condition, discussed above in connection with FIGS. 4I-L. As can be seen from the simulated current drive waveform of FIG. 7B, as switch B opens, and operating as a buck switch, current flows to the A switch (from the C switch) as a synchronous switch as discussed above in connection with FIG. 4K. As switch A opens and switch B closes, current conducts to the B switch (from the C switch) as buck current flow as discussed above in connection with FIG. 4L.

The exemplary simulated waveforms of FIGS. 8A and 8B illustrate switching gate drive waveforms and current waveforms during a second zero crossing condition (i.e., from negative to positive peak), discussed above in connection with FIGS. 4M-P. As can be seen from the simulated current drive waveform of FIG. 8B, switch A operates as a synchronous switch with a large duty cycle, and switch B operates as a buck switch with a very small duty cycle before the zero crossing. After the zero crossing, A operates as a buck switch with a very small duty cycle and switch B operates as a synchronous switch with a large duty cycle. Thus, switch A opens at zero crossing, current instantaneously switches directions from the B switch (to the D switch) in synchronous/buck current flow as discussed above in connection with FIG. 4O. As the output crosses from the negative peak to the positive peak of the sine wave, switch B opens and switch A closes, causing current to instantaneously switch directions from the A switch (to the D switch) in buck/synchronous current flow as discussed above in connection with FIG. 4P.

Figure 9A:
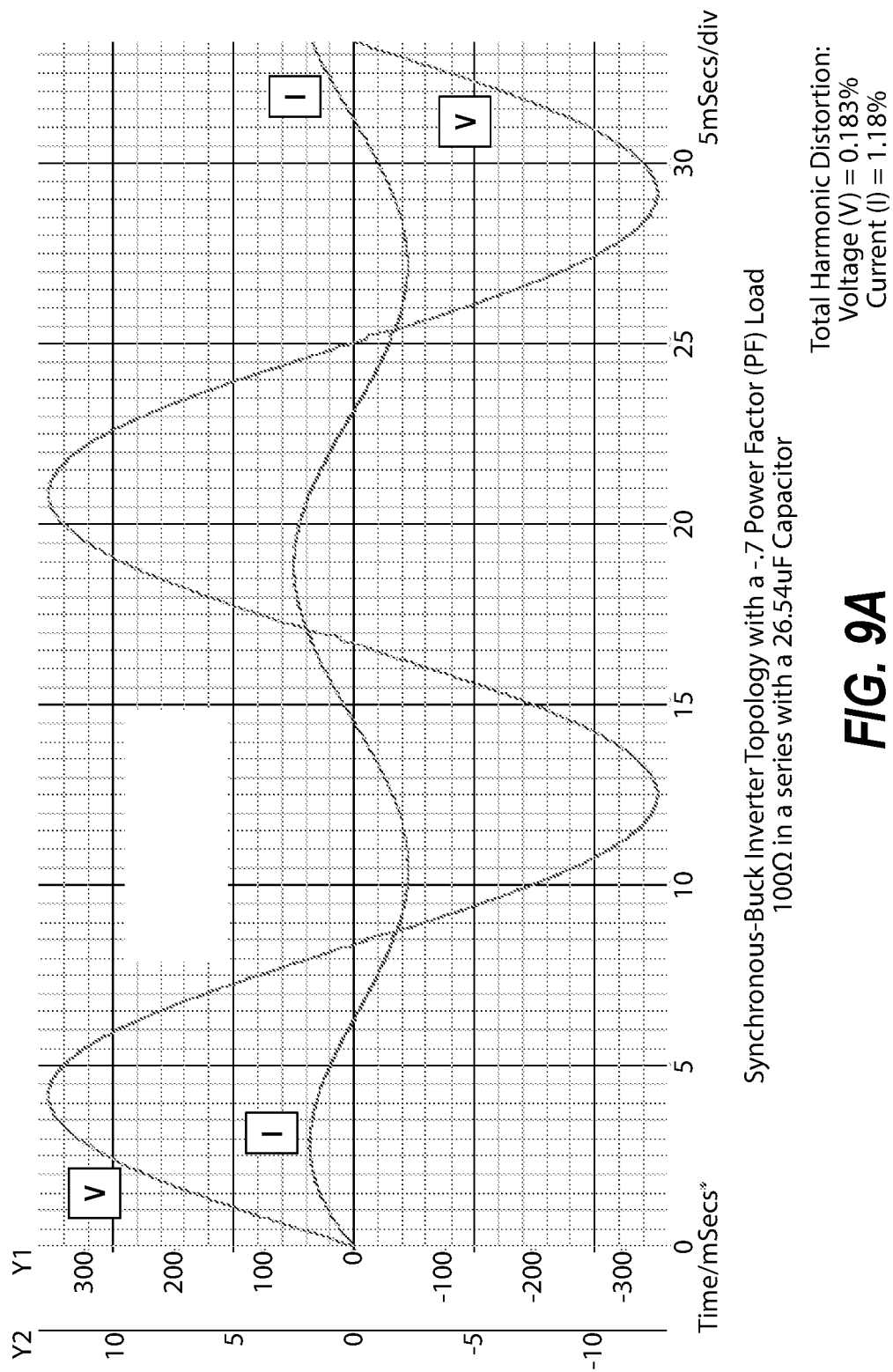
FIGS. 9A-E illustrate waveforms exemplifying operational conditions for the embodiment of FIG. 3A.
Figure 9B:
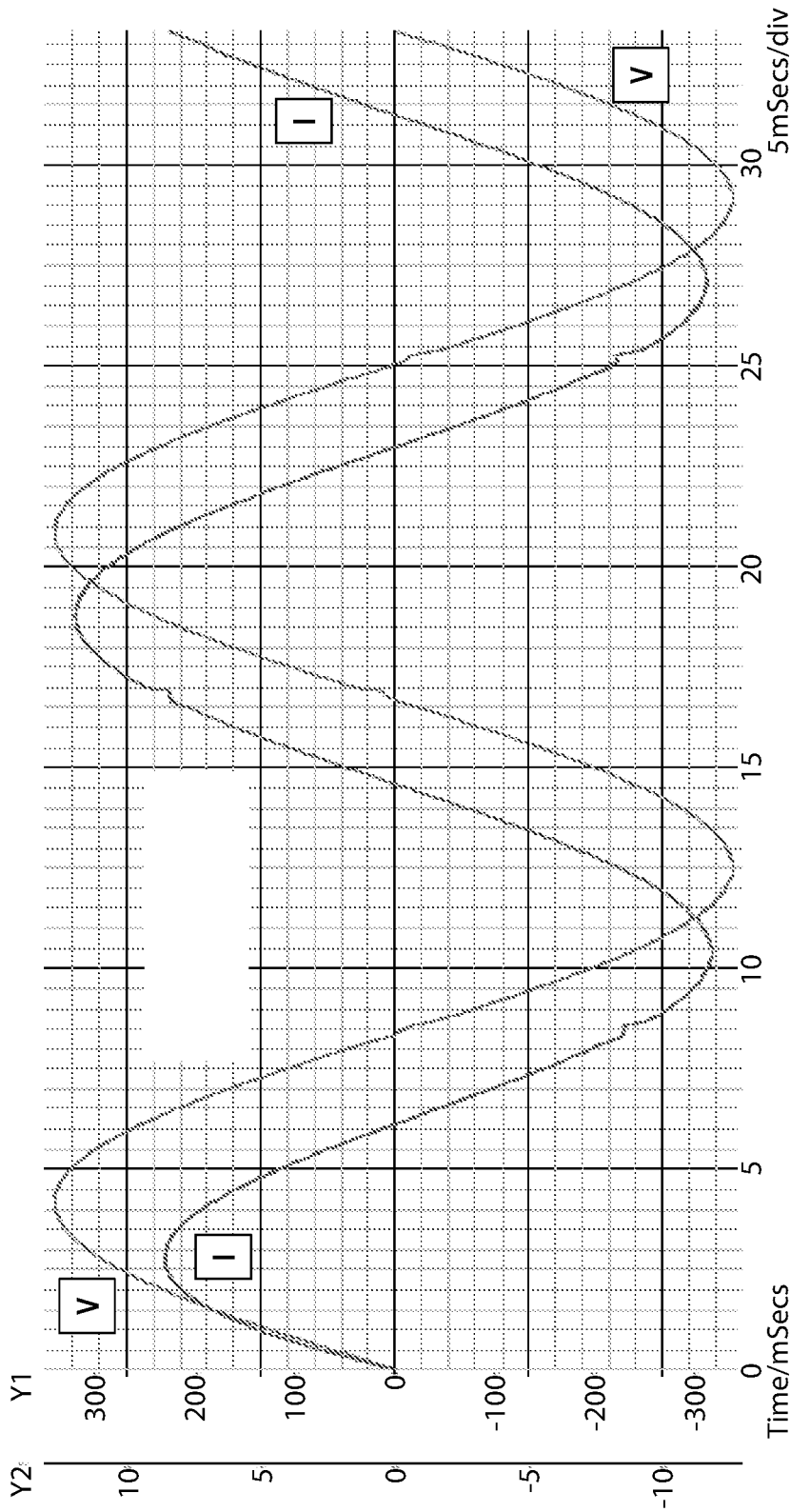

Turning now to FIGS. 9A-E, exemplary simulated waveforms are provided for inverter 300. For the purposes of this discussion, comparison will be made to corresponding FIGS. 2A-E to illustrate advantageous characteristics of inverter 300. FIG. 9A is an exemplary simulated waveform for inverter 300, operating under a −0.7 power factor (PF) load, utilizing 100Ω in series with a 26.54 μF capacitor. As can be determined from the voltage (V) and current (I) waveforms, voltage distortion is approximately 0.183%, while current distortion is approximately 1.18% (compare to FIG. 2A, where voltage distortion is 24%, and current distortion is approximately 34.1%). As the resistance is reduced to 20.63Ω in series with a 130.3 μF capacitor, the total harmonic distortion for voltage (V) in FIG. 9B is approximately 0.531% and 1.56% for current (I) (compare to FIG. 2B wherein distortion was immeasurable).

Figure 9C:
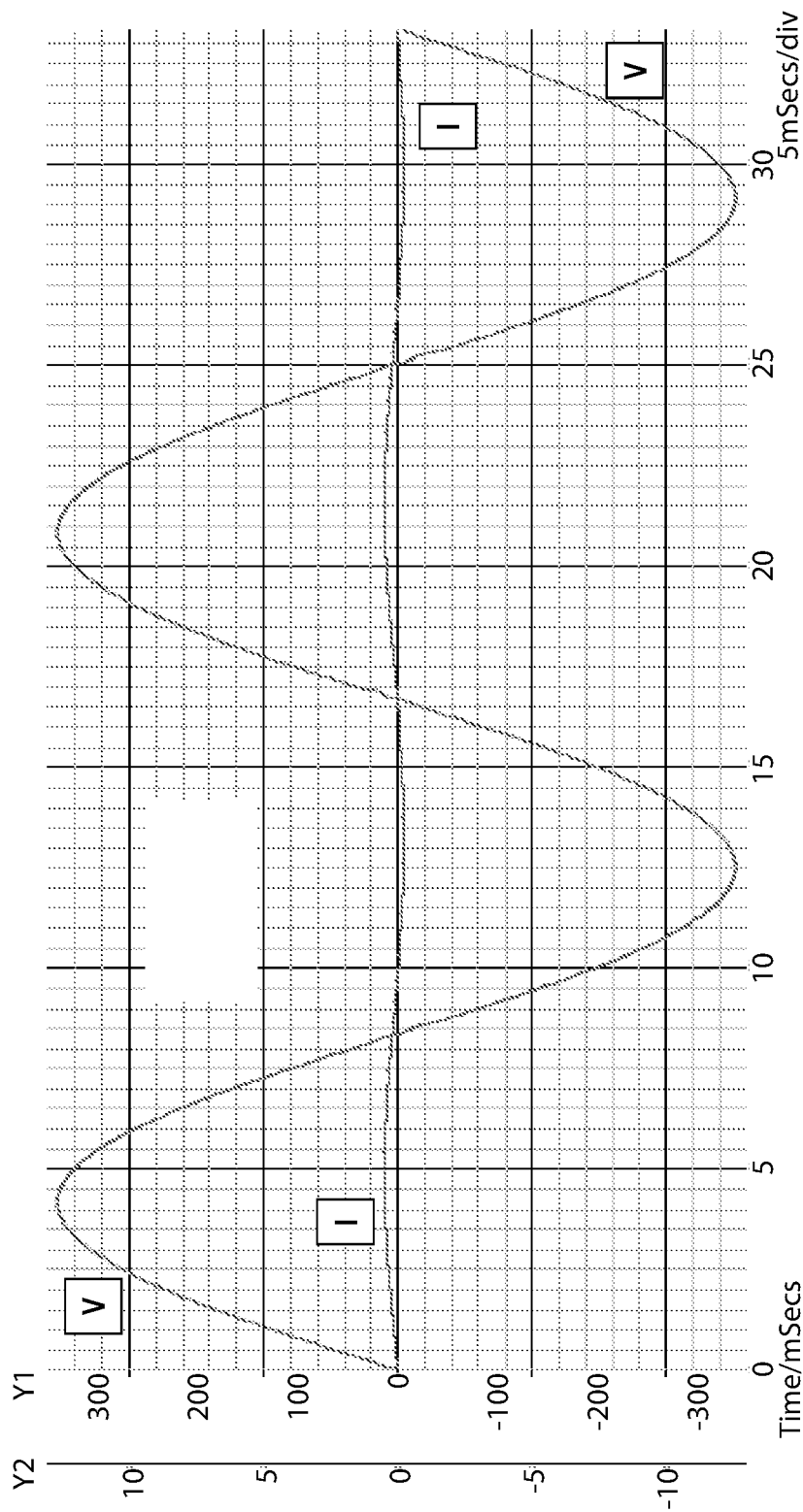
Figure 9D:
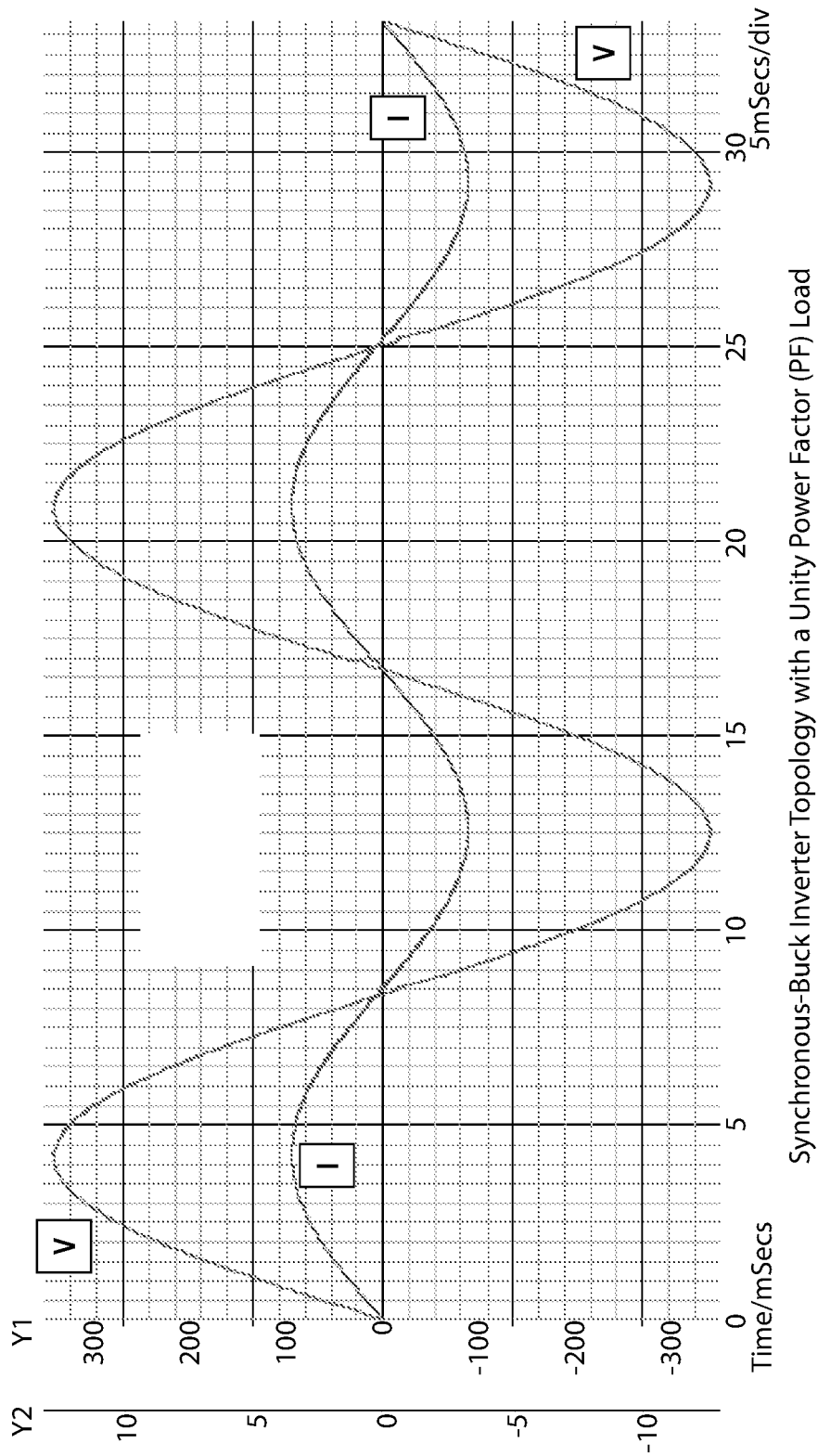
Figure 9E:
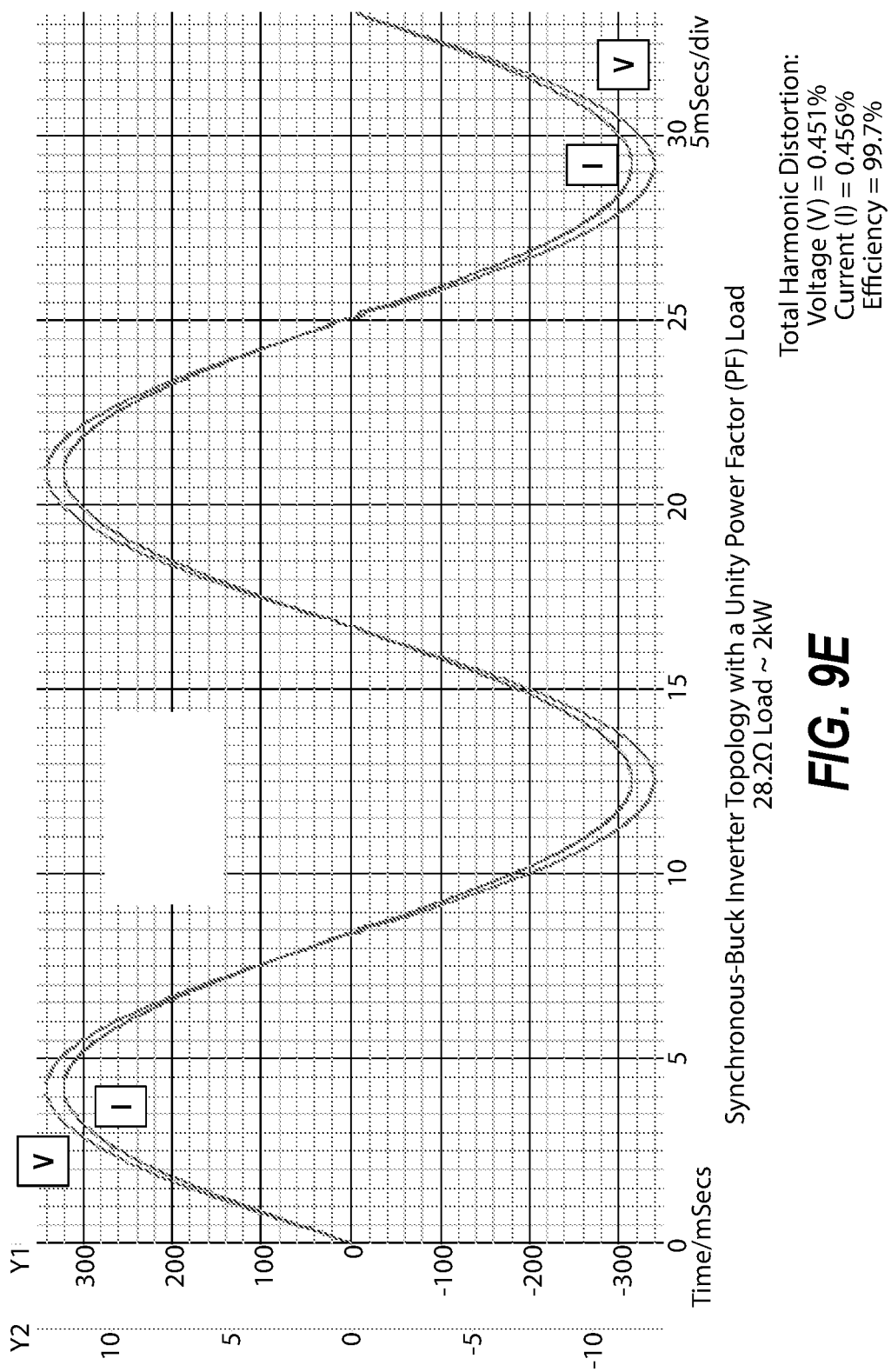

In FIG. 9C, utilizing a unity power factor load of 1 kΩ for inverter 300, the total harmonic distortion measured for the voltage (V) in the simulated waveform is 0.164% and 0.276% for current(I) (compare to FIG. 2C, where voltage distortion is 26.9%, and current distortion is 25.1%). Utilizing a unity power factor with a reduced load of 100Ω for inverter 300 (FIG. 9D), the total harmonic distortion measured for the voltage (V) is 0.174% and 0.175% for current (I), with a total power of 585.6 W (compare to FIG. 2D where voltage distortion is 2.79%, and 3.41% for current (I) for the same total power). In FIG. 9E, utilizing a unity power factor load of 28.2Ω at approximately 2 kW, total harmonic distortion measured for the voltage (V) is 0.451% and 0.456% for current (I) with an efficiency of 99.7% (compare to FIG. 2E where voltage distortion is 1.52%, and current distortion is 1.71% with 98.2% efficiency).

Figure 10A:
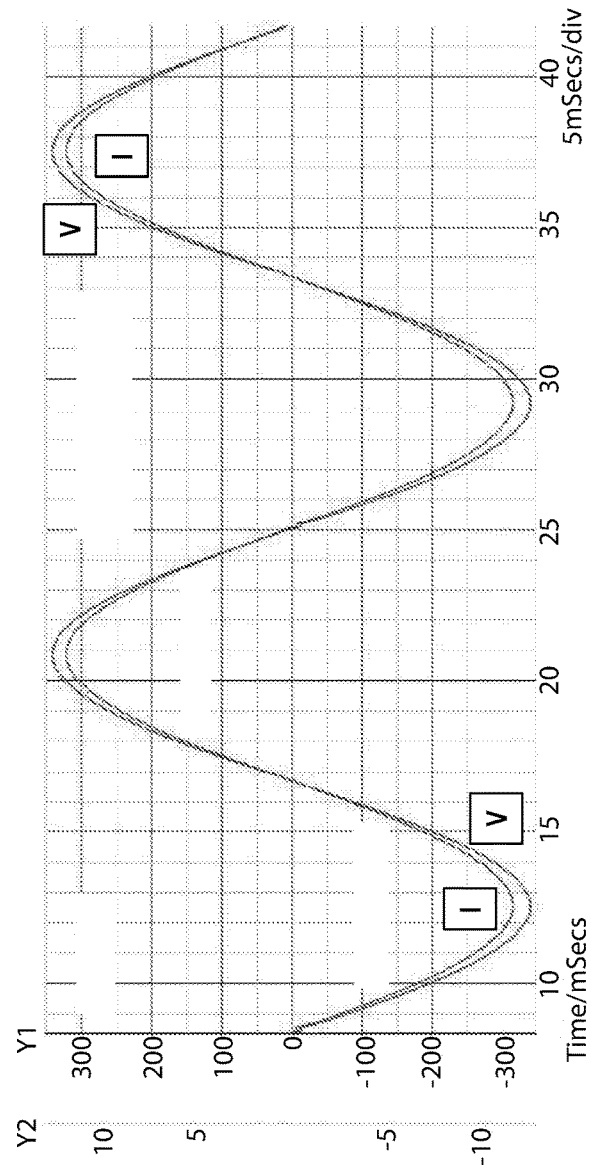
FIG. 10A illustrates an exemplary waveform for the synchronous-buck inverter of FIG. 3A and FIG. 4 showing improved voltage and current distortion.
Figure 10B:
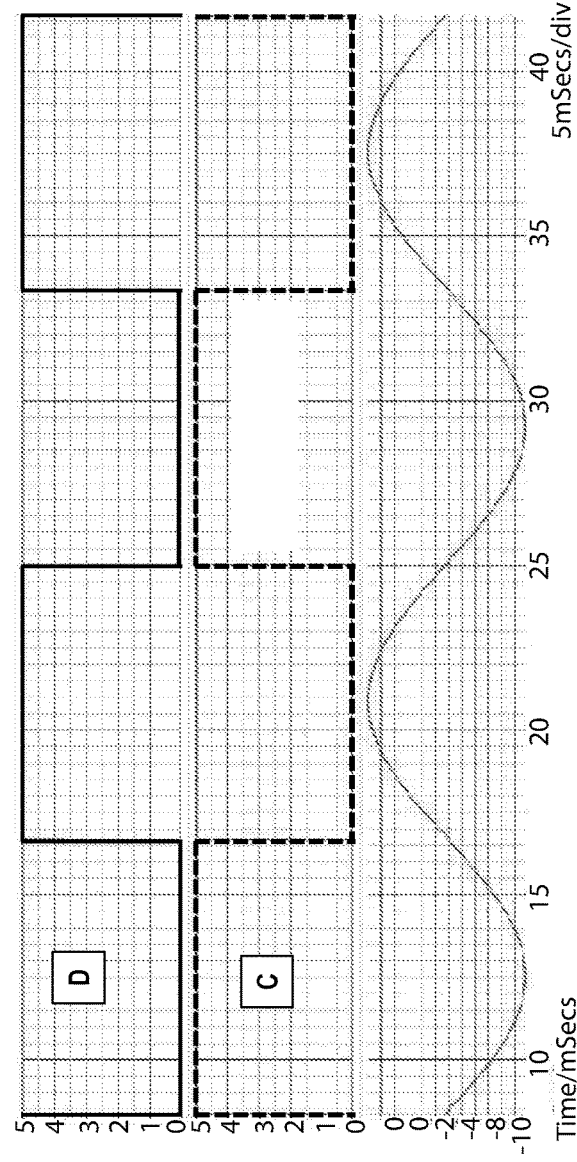
FIG. 10B illustrates an exemplary gate drive waveform for switches C and D for the synchronous-buck inverter of FIG. 3A and FIG. 4.

It can be appreciated by those skilled in the art that the inverter configurations disclosed herein provide meaningful efficiency increases and substantial distortion reduction. Turning to FIG. 10A, an illustration is provided of an exemplary simulated waveform for the synchronous-buck inverter of FIG. 3A and FIG. 4 showing improved voltage and current distortion. FIG. 10B illustrates an exemplary simulated gate drive waveform for switches C and D for the synchronous-buck inverter of FIG. 3A and FIG. 4 showing the improved current output.

Figure 11:
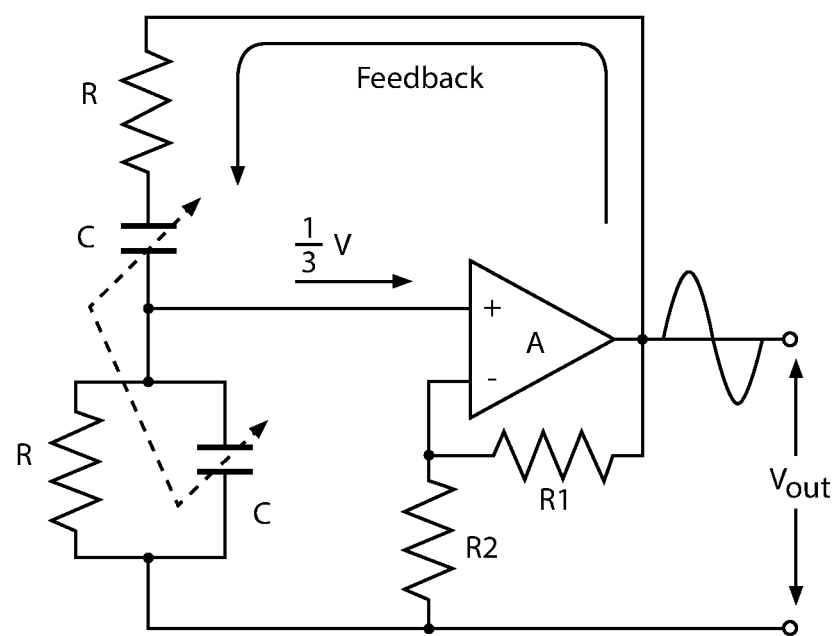
FIG. 11 illustrates a conventional Wien bridge oscillator configured to provide a sine wave output.

Turning now to FIG. 11, a conventional Wien bridge oscillator for forming sine waves over a various range of frequencies. The bridge comprises four resistors and two capacitors. The oscillator can also be viewed as a positive gain amplifier combined with a band pass filter that provides positive feedback. In use, the output of the operational amplifier (A) is fed back to both the inputs (− and +, or inverting and non-inverting) of the amplifier. One portion of the feedback signal in FIG. 11 is connected to the inverting input terminal (negative feedback) via the resistor divider network of R1 and R2 which allows the amplifiers voltage gain to be adjusted within narrow limits. The other part is fed back to the non-inverting input terminal (positive feedback) via the RC Wien Bridge network.

The RC network is connected in the positive feedback path of the amplifier and has zero phase shift at just one frequency. Then at the selected resonant frequency (fr), the non-inverting input may be slightly larger than the inverting input, allowing the circuit to oscillate.

In the oscillator of FIG. 11, the voltage gain of the amplifier circuit must be equal to or greater than three "Gain=3" for oscillations to start because as will be explained below, the non-inverting input is ⅓ of the output voltage (⅓V). This value, (Av≥3), is set by the feedback resistor network, R1 and R2 and for a non-inverting amplifier this is given as the ratio 1+(R1/R2). Also, due to the open-loop gain limitations of operational amplifiers, frequencies above 1 MHz are unachievable without the use of special high frequency op-amps.

The Wien bridge oscillator if FIG. 11 is based on a frequency-selective form of a Wheatstone bridge circuit. The Wien bridge oscillator is a two-stage RC coupled amplifier circuit that uses a feedback circuit consisting of a series RC circuit connected with a parallel RC of the same component values producing a phase delay or phase advance circuit depending upon the frequency. At the resonant frequency fr the phase shift is 0°.

Figure 12:
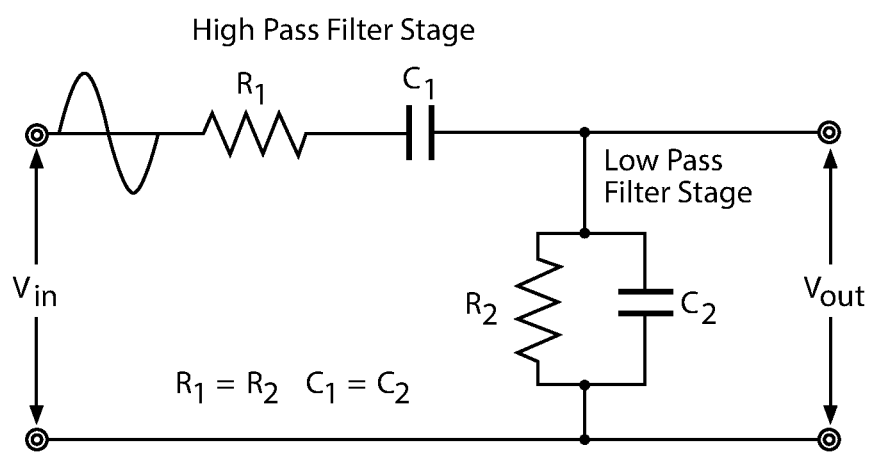
FIG. 12 illustrates a RC phase shift network model of the Wien bridge oscillator of FIG. 11.

Turning now to FIG. 12, the conventional RC network may be modeled as a series RC circuit connected to a parallel RC forming basically a High Pass Filter connected to a Low Pass Filter producing a very selective second-order frequency dependant band pass filter at the selected frequency (Fr). At low frequencies, the reactance of the series capacitor (C1) is very high so it acts like an open circuit and blocks any input signal at $V_{in}$. Therefore there is no output signal, $V_{out}$. At high frequencies, the reactance of the parallel capacitor, (C2) is very low so this parallel connected capacitor acts like a short circuit on the output so again there is no output signal.

Figure 13A:
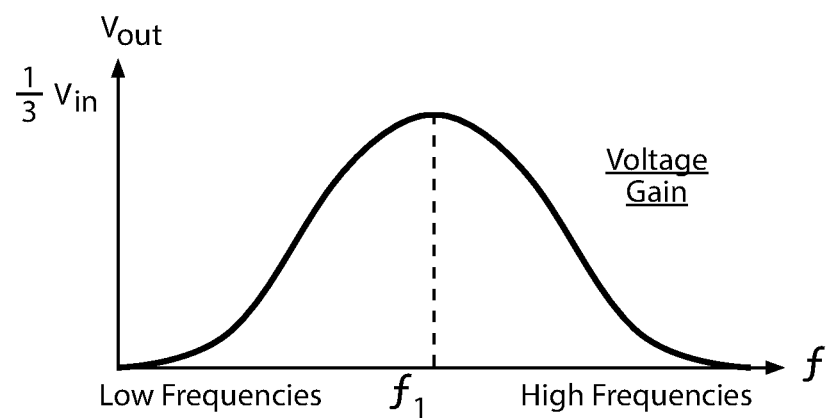
FIG. 13A illustrates a simulated waveform for a oscillator voltage gain for the Wien bridge oscillator of FIG. 11.
Figure 13B:
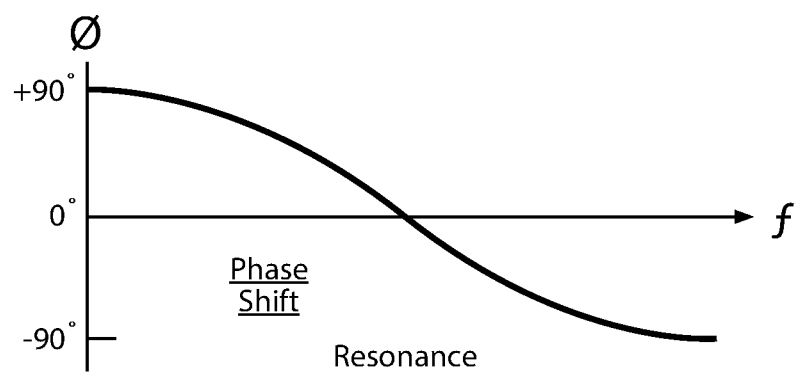
FIG. 13B illustrates a simulated waveform for a oscillator phase shift for the Wien bridge oscillator of FIG. 11.

However, between these two extremes the output voltage reaches a maximum value with the frequency at which this happens being called the resonant frequency, (Fr). At this resonant frequency, the circuit reactance equals its resistance as $X_c=R$ so the phase shift between the input and output equals zero degrees. The magnitude of the output voltage is therefore at its maximum and is equal to one third (⅓) of the input voltage as shown in FIGS. 13A and 13B. It can be seen that at very low frequencies the phase angle between the input and output signals is "positive" (phase advanced), while at very high frequencies the phase angle becomes "negative" (phase delay). In the middle of these two points the circuit is at its resonant frequency, (fr) with the two signals being "in-phase" or 0°. This resonant frequency point may be defined as $$fr = \frac{1}{2\pi RC}$$

where $f_r$ is the resonant frequency in hertz, R is the resistance in ohms, and C is the capacitance in farads. The frequency selective RC network forms the basis of the Wien bridge oscillator circuit, where the RC network configured across a non-inverting amplifier as shown in FIG. 1 has a gain of 1+R1/R2.

Figure 14:
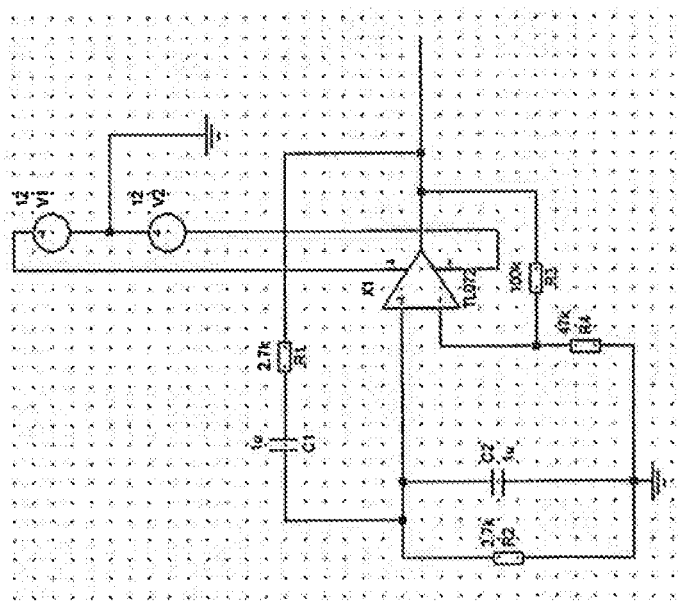
FIG. 14 illustrates a detailed configuration for a conventional Wien bridge oscillator for providing a sine wave output.
Figure 15:
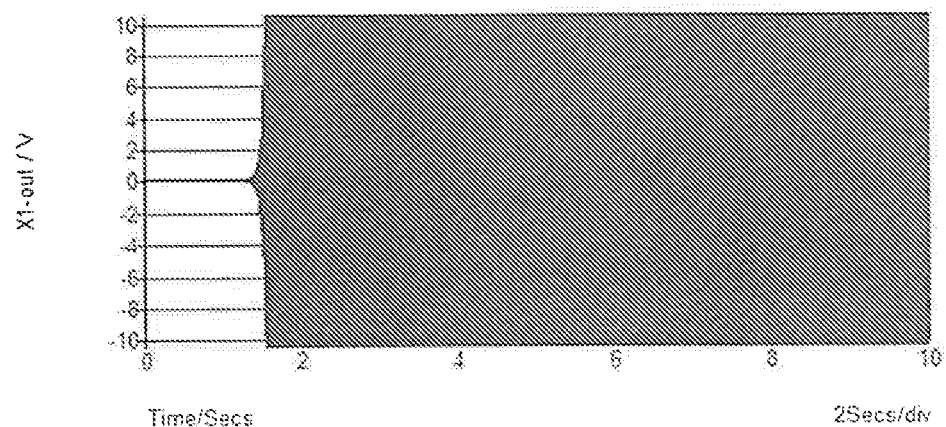
FIG. 15 shows a simulated output waveform for the Wien bridge circuit of FIG. 14 or FIG. 11, illustrating an at least partially saturated state.
Figure 16:
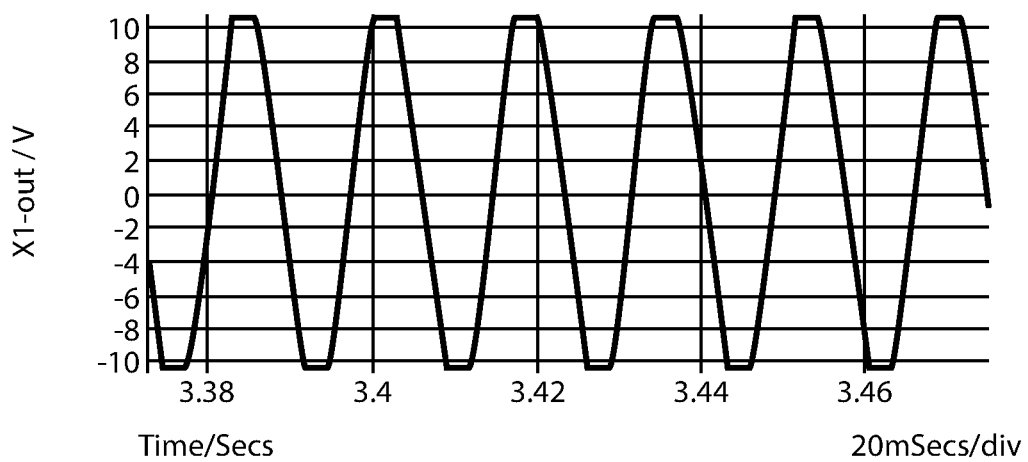
FIG. 16 shows a magnification of the simulated output waveform of FIG. 15 for the Wien bridge circuit of FIG. 14 or FIG. 11, illustrating an at least partially saturated state.

Turning now to FIG. 14, a conventional Wien bridge oscillator, similar to that disclosed in FIG. 11 is disclosed, where illustrative resistive and capacitive values are shown. Here, it can be seen that the gain of Wien bridge oscillator is 1+R1/R2, or 1+100 kΩ/47 kΩ=3.13. The resonant frequency of the Wien bridge oscillator is fr=½πRC, or 1/(6.28×2.7 kΩ×1 uF)=58.97 Hz. As can be seen from the simulated output waveform of FIG. 15, the Wien bridge oscillator starts oscillation at a gain of 3.13, which in turn saturates at peak voltages. This saturation may be seen in the magnified simulated waveform of FIG. 16, where it can be seen in greater detail how the op-amp saturates at the peak voltages because the gain is greater than 3.

Figure 17:
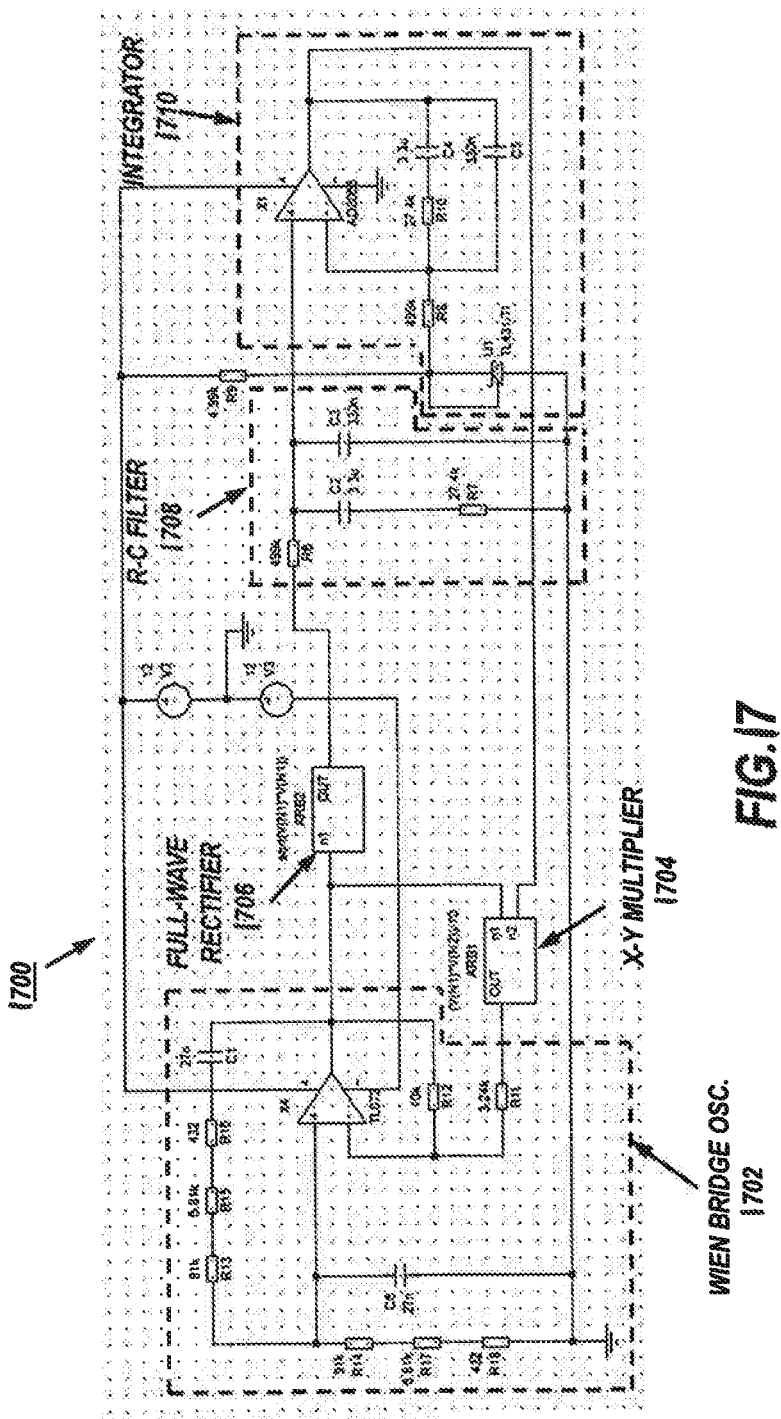
FIG. 17 shows a Wien bridge oscillator circuit under an exemplary embodiment comprising a Wien bridge oscillator, an XY multiplier circuit, a full-wave rectifier circuit, an R-C filter, and an integrator.

Turning now to FIG. 17, a Wien bridge oscillator circuit 1700 is disclosed under an illustrative embodiment that may be configured to be more reliable, produces less distortion in the output, and provides greater amplitude stability than conventional Wien bridge oscillators. The circuit 1700 may be comprised of a Wien bridge oscillator circuit portion 1702, an XY multiplier circuit portion 1704, a full-wave rectifier circuit portion 1706, an R-C filter circuit portion 1708 and an integrator circuit portion 1710. It should be appreciated by those skilled in the art that, while the illustration provides specific components and component values (e.g., resistors, capacitors, etc.), any alternate and/or additional components and component values may be used to perform the functions disclosed herein.

Wien bridge oscillator circuit portion 1702 comprises an operational amplifier X4 comprising a parallel RC network portion (e.g., R14, R17, R18, C6) coupled to the non-inverting input of amplifier X4, and to a series RC network portion (e.g., R13, R15, R16, C1), which is configured along a positive feedback path of amplifier X4 as shown in FIG. 17. Wien bridge oscillator circuit 1702 also includes a first negative feedback path through resistor R12 and a second negative feedback path via XY multiplier 1704.

In some illustrative embodiments, XY multiplier 704 may be configured to multiply in a plurality of quadrants (e.g., $(X_1-X_2)(Y_1-Y_2)/10V$), divide in a plurality of quadrants (e.g., with a 10V $Z/(X_1-X_2)$), perform transfer functions and square roots in one quadrant (e.g., with a transfer function ± $\sqrt{10VZ}$). In the illustrative embodiment of FIG. 17, XY multiplier 1704 is configured to receive Wien bridge oscillator circuit 1702 output feedback at input $n_1$ and to receive a feedback output from integrator X1 of integrator circuit portion 1710 at input $n_2$. In one illustrative embodiment, multiplier 1704 is configured to perform a transfer function $V_{OUT}=(V(n_1)*V(n_2))/10$ in order to change the scale of the signal and in order to provide dynamic gain control for the Wien bridge oscillator circuit 1702.

Figure 18:
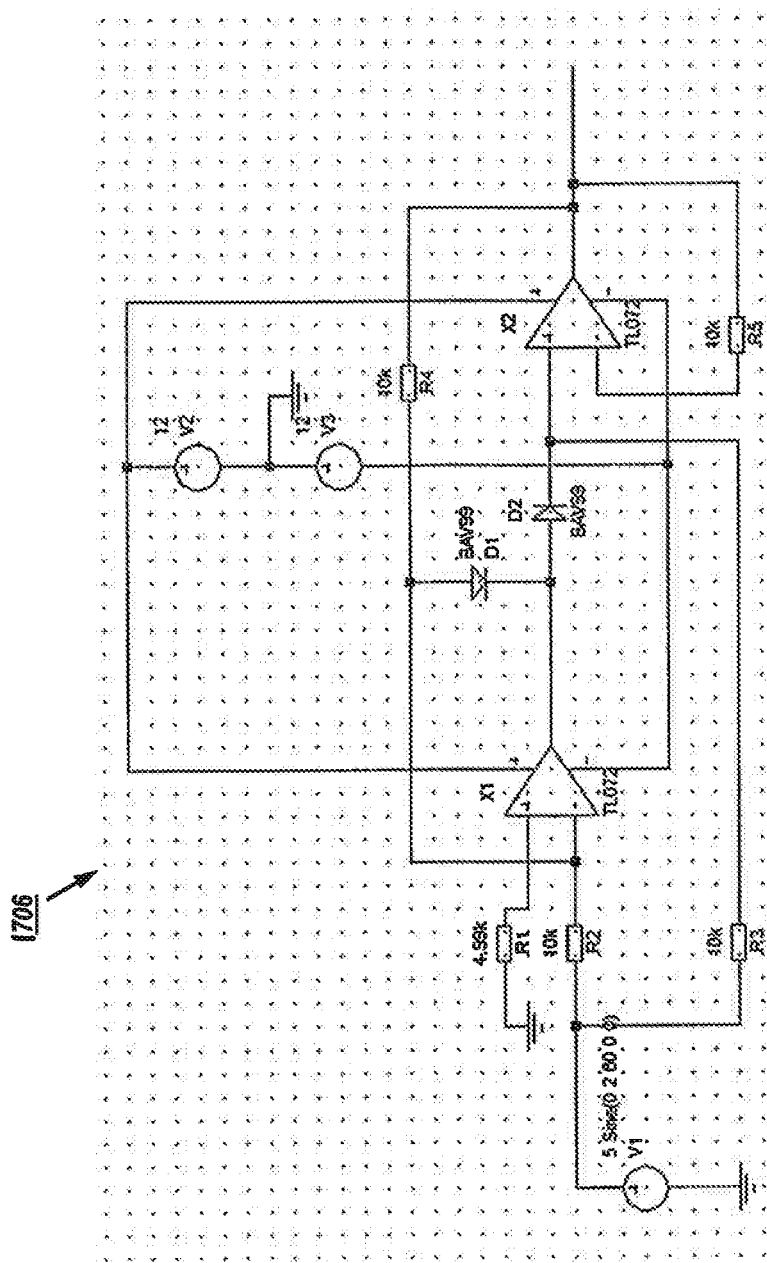
FIG. 18 shows an illustrative full-wave rectifier circuit for use in the embodiment of FIG. 17 under an embodiment.

Full wave rectifier circuit portion 1706 may comprise circuitry to enable a transfer function $V_{OUT}=\text{sqrt}(V(n_1)*V(n_1))$ on the output of Wien bridge oscillator circuit 1702 and provide the output to R-C filter portion 1708 comprising resistors R6-R7 and capacitors C2-C3. An illustrative, non-limiting example of full wave rectifier is shown in FIG. 18, where a sine wave is provided in V1, where a negative half-cycle is received via resistor R2 in an inverting (−) input of operational amplifier X1, while the positive half-cycle is passed through resistor R3 to non-inverting input of operational amplifier X2. As the non-inverting input of amplifier X1 is coupled to ground, amplifier X1 produces a positive output that is also coupled to the non-inverting input of operational amplifier X2.

Using the illustrative, non-limiting, component values provided, it can be seen that, for the Wien Bridge oscillator circuit RC phase shift network circuitry, R1=R2=98.242 kΩ, C1=C2=27 nF, and an illustrative resonant frequency of the Wien Bridge Oscillator circuitry is $f_r$=1/R1C1=1/R2C2=60 Hz. Under the illustrative configuration, the full wave rectifier may produce substantially perfect full wave rectification of the sine wave input.

Referring back to FIG. 17, a differential integrator circuit portion 1710 is coupled to the output of the full wave rectifier and the average of the full wave signal is compared to a 2.5 volt reference that may be produced by a programmable shunt regulator U1, whose reference terminal is coupled to a feedback output of integrator X1 via a series-parallel RC circuit (R8, R10, C4, C5) as shown in FIG. 17. As mentioned above, the output of the integrator X1 is fed to one input ($n_2$) of the XY multiplier 1704.

The integrator circuit portion 1710 may be configured to compare and integrate a difference between the average voltage reference (2.5V) and the feedback average voltage of the full wave rectifier waveform. In an illustrative, non-limiting example, the peak voltage of the Wien bridge oscillator sinusoidal waveform may be controlled at 3.9V with equation $V_{pk}=V_{avg}/0.637$ ($V_{pk}$=2.5V/0.637=3.9V).

The $n_1$ input of the XY multiplier is connected to the output of the Wien bridge oscillator circuit portion 1702. In an illustrative embodiment, in the multiplier, the output of the integrator circuit portion 1710 multiplies the output of the Wien bridge oscillator, (e.g., a DC voltage times a sine wave), which may produce a controlled variable amplitude sine wave. The amplitude of the output sin wave is controlled because it has to satisfy the requirements of the integrator.

Figure 19:
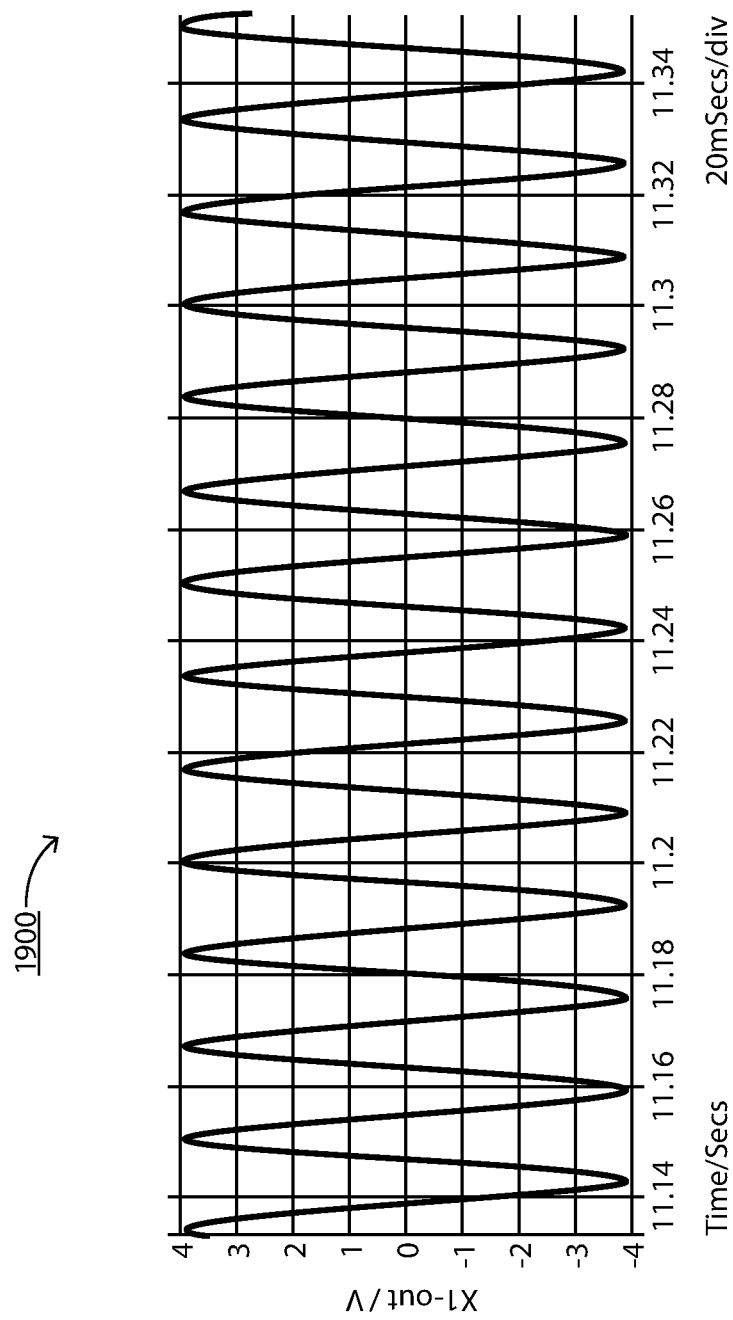
FIG. 19 shows a simulated output waveform for the Wien bridge circuit of FIG. 18, illustrating a reduction or elimination of saturation under an embodiment.
Figure 20:
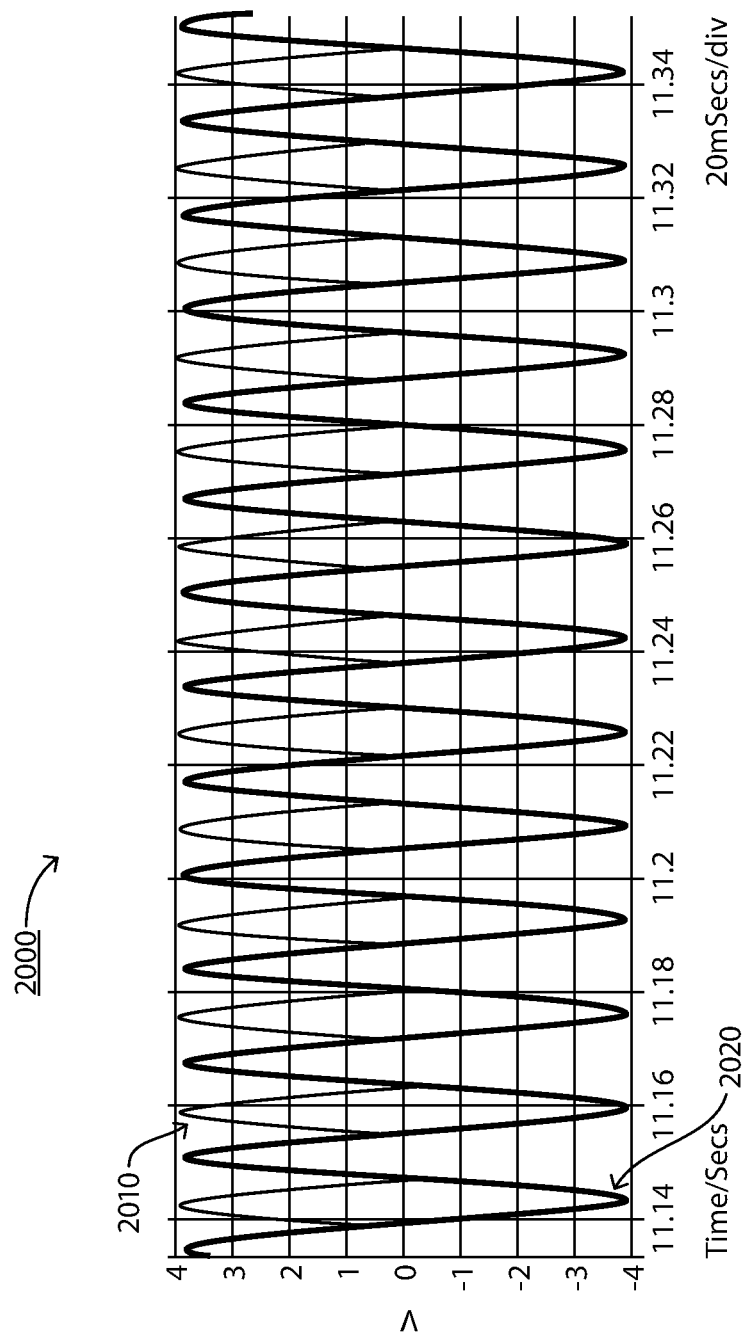
FIG. 20 shows a simulated output waveform of the Wien bridge circuit of FIG. 18, illustrating the output voltage of the full-wave rectifier together with a sinusoidal output voltage of the Wien bridge rectifier under an embodiment.
Figure 21:
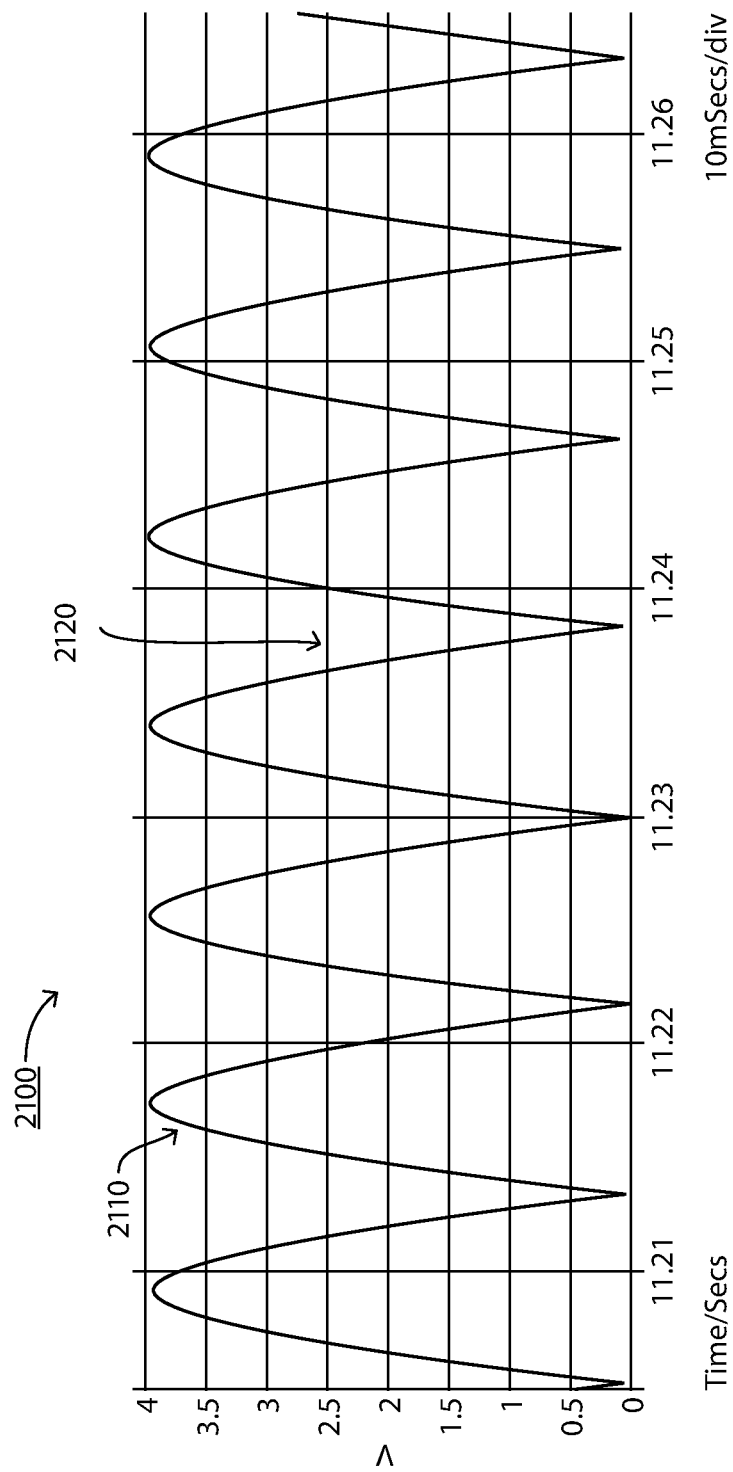
FIG. 21 shows a simulated output waveform of the Wien bridge circuit of FIG. 18, illustrating the output voltage of the full-wave rectifier together with reference voltage of an averaged full-wave rectifier and averaged value of the full-wave output voltage under an embodiment.

Turning now to FIG. 19, an illustrative, simulated output waveform for Wien bridge oscillator circuit 1700 is shown. It can be seen from the non-limiting illustration that the peak voltage is controlled at 3.9V, and has no substantial distortion or saturation compared to the illustration of FIG. 16. In an illustrative, non-limiting example, FIG. 20 shows the sinusoidal voltage 2020 of the Wien bridge oscillator circuit 1700 together with the voltage output 2010 of the full wave rectifier 1706 which substantially produces a 3.9V peak on every positive and negative peak of the sinusoidal voltage 2020. In another illustrative, non-limiting example, FIG. 21 shows a full wave rectifier voltage output 2110 together with reference voltage of averaged full wave rectifier waveform (2.5V) and average value of the full wave output voltage (2120).

Various operational characteristics of the Wien bridge oscillator disclosed herein have many advantageous applications in electronic circuitry. Some non-limiting operational characteristics of the Wien bridge oscillator include the dynamic gain control of the oscillator and the substantially "pure" sinusoidal waveform that is produced. In some illustrative, non-limiting embodiments, the present Wien bridge oscillator may be used as an input for voltage reference in power applications, such as synchronous-buck circuits (e.g., inverters, converters, etc.).

Figures 22A, 22B:
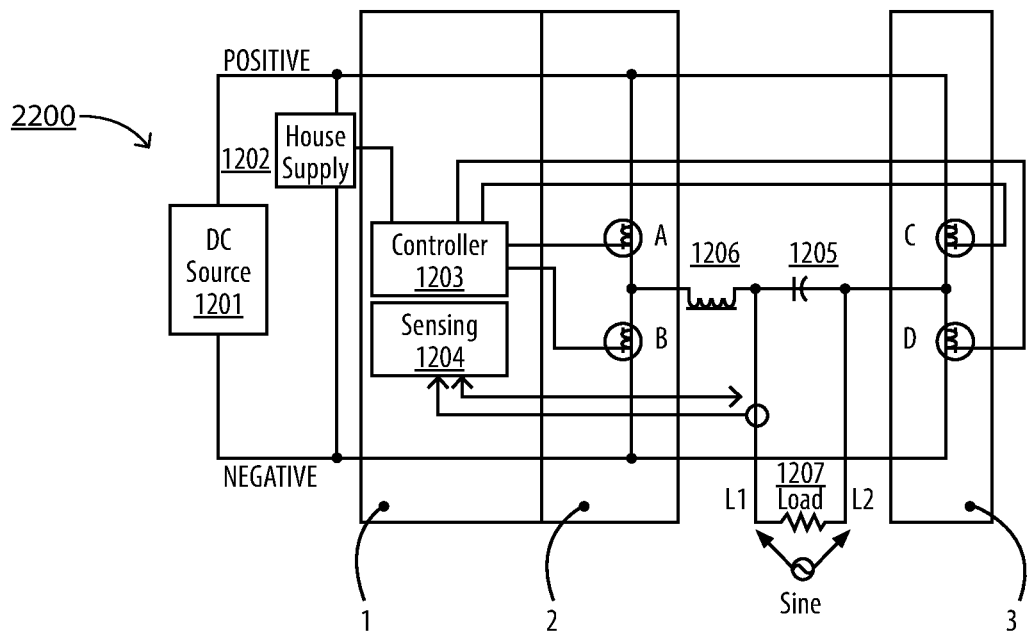
FIG. 22A illustrates an exemplary synchronous buck inverter topology under one illustrative embodiment, where the inverter comprises a high-frequency switching portion, a synchronous buck portion and a low frequency switching stage coupled to a discharge capacitor configured to be coupled to a load, where the synchronous buck inverter topology is configured to receive a voltage reference input from the Wien bridge oscillator of FIG. 17.
FIG. 22B illustrates a switching sequence for switches A-D of the embodiment of FIG. 12A under positive half wave and negative half wave conditions.

Turning now to FIG. 22A, synchronous buck inverter topology 2200 is disclosed in an illustrative embodiment. Inverter 2200 comprises a DC source 2201 and a house supply 2202 for providing positive and negative voltages to high frequency switches A-B and low frequency switches C-D, as shown. In an embodiment, switches A-D are comprised of high frequency switches, such as field effect transistors (FETs). It should be understood by those skilled in the art that other switches or suitable switching mechanisms may be employed, depending on the specific application of the inverter. Inverter 2200 may comprise a high frequency switching control (1) comprising controller 2203 and sensing circuit 2204.

Figure 22C:
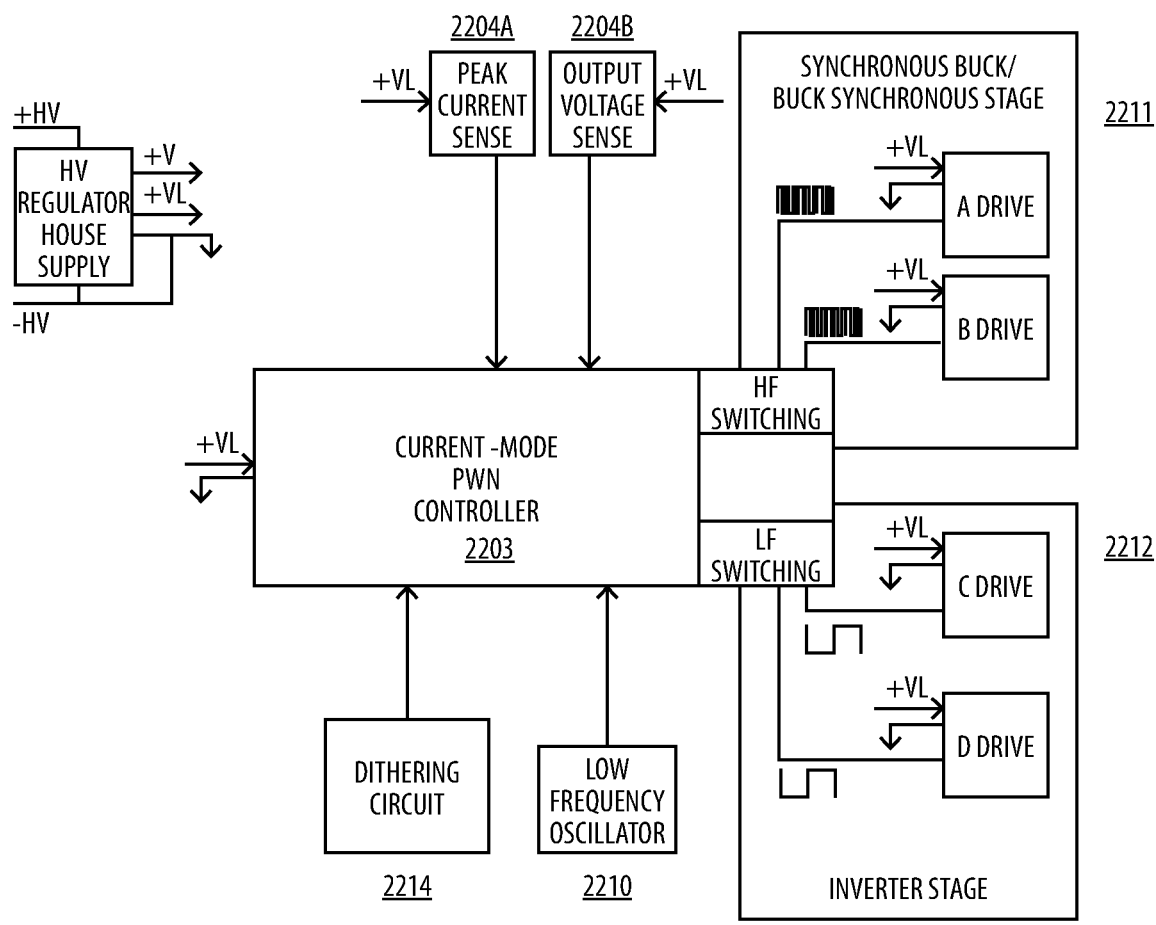
FIG. 22C provides another illustration of a synchronous buck inverter under another embodiment where the synchronous buck inverter is configured to receive a voltage reference input from the Wien bridge oscillator of FIG. 17.

In an embodiment, controller may comprise a current-mode PWM controller (see FIG. 22C) and sensing circuit 2204 comprises a peak current sense and an output voltage sense (see refs. 2204A-B of FIG. 22C). Controller 2203 may be operatively coupled to a gate of each of switches A-D, while sensing circuit 2204 may be coupled to a load line as is shown illustratively in FIG. 22A. Alternatively, controller may be a microprocessor running firmware to control switches A-D.

Controller 2203 may be configured to provide a low frequency sine wave (or other suitable signal) to effect switching control on the synchronous-buck portion of inverter 2200. In some illustrative embodiments, controller 2203 may utilize the Wien bridge oscillator 1700 disclosed above. Main switching may be realized using synchronous-buck switching portion (2), comprising switches A and B, to invert every half cycle of the frequency of the signal provided by controller 2203. The inverting process thus creates a positive and negative transition of the sine wave signal. Low frequency switching stage (3) comprises switches C and D and may be configured to operate as zero voltage switching (ZVS) and zero current switching (ZCS) drives Notably, using the configuration of FIG. 22A, the charge on output capacitor 2205 is discharged to zero on every zero crossing of low frequency switching stage (3). Compared to a conventional synchronous buck, the configuration of FIG. 22A advantageously discharges energy every half cycle. During this discharge of energy, the zero crossing distortion in the low frequency sine wave is greatly reduced.

In an embodiment, the fabricated switch material for synchronous-buck switching portion (2) (e.g., switches A-B) may be different from the fabricated switch material for low frequency switching stage (3) (e.g., switches C-D). In an advantageous embodiment, switches A-B may be fabricated on a Silicon Carbide (SiC) platform, which allows the switches to operate at higher frequencies and deliver higher circuit efficiencies. As SiC switches have a reduced on state drain to source resistance ($R_{ds(on)}$, this improves on-state voltages and allows for higher power applications Since a SiC switch is a majority carrier device, there is no associated storage time to cause current tail issues within the switch.

Consequently, the SiC switch enables high voltage switching at higher frequencies (e.g., greater than 50 kHz). Additionally, the total gate charge on a SiC switch is a multitude (e.g., 3 times) less than for a comparable silicon switch, resulting in yet further gains in the upper frequency limit and/or reduction of switching loss. By utilizing SiC switches (A-B) in the synchronous-buck switching portion (2), numerous advantages may be achieved, including, but not limited to, improved switching, reduced harmonic distortion, reducing the need for large filters (e.g., inductors) at the output, and improved load step response. Similar advantages may be realized by using other high-frequency majority-carrier switches, such as Gallium Nitride (GaN), which also has a total gate charge that is a multitude (e.g., one-fifth) less than comparable silicon switches and reduced $R_{ds(on)}$, allowing switching applications to exceed 2 MHz in frequency and facilitating large step down ratios in the synchronous-buck switching portion (2).

Turning now to FIG. 22B, an exemplary switching sequence is illustrated wherein switches A and B of the synchronous-buck switching portion (2) simultaneously and alternately provide high frequency PWM (x) and high frequency PWM complement (x') for each positive half wave and negative half wave. Switches C and D for the low frequency switching stage (3) are configured such that switch C is Orr for each positive half wave and ON for each negative half wave, while switch D is ON for each positive half wave and OFF for each negative half wave.

FIG. 22C is another exemplary embodiment of a synchronous buck inverter, similar to inverter 2200, wherein high voltage regulator house supply 2202 receives input power (+HV, −HV) from a source (e.g., 2201) and produces output voltage +V for each of the switch drives (A-D Drive) and voltage +VL for current-mode PWM controller 2203, peak current sense 2204A and output voltage sense 2204B. Controller 2203 may provide low frequency signals (e.g., sine wave) via low frequency oscillator 2210, which may utilize the Wien bridge oscillator 1700 disclosed above. Controller 2203 as illustrated in the embodiment of FIG. 22C may comprise a high frequency (HF) switching portion and low frequency (LF) switching portion, wherein HF switching portion activates/deactivates switches associated with A DRIVE and B DRIVE of synchronous-buck/buck-synchronous stage 2211. LF switching portion may activate/deactivate switches associated with C DRIVE and D DRIVE of inverter stage 2212.

In an illustrative embodiment, the PWM controller 2203 may be coupled to a dithering circuit 2214 which may be configured to apply a waveform to a timing circuit of controller 2203 to dither the switching frequency. For example, a triangular waveform may be applied to a timing circuit of controller 2203 to cause the frequency to change a certain amount (e.g., ±10 kHz) for a given switching frequency (e.g., 100 kHz). By reducing switching frequencies at zero-crossings, the inverter performance may be improved by increasing resolution and decreasing harmonic distortion.

For example, a triangular waveform (e.g., 2-3V peak) may be applied for ±8 kHz dithering to a timing circuit to cause the frequency to change a certain amount for a given switching frequency. Accordingly, under the non-limiting example, the switching frequency dither increases to 108 kHz at a peak, and decreases to 92 kHz at a zero crossing. By reducing switching frequencies at zero-crossings, an inverter performance may be improved by increasing resolution and decreasing harmonic distortion. Of course, it should be appreciated by those skilled in the art that other suitable dithering frequency ranges may be used, and are not limited to the specific example.

As mentioned above in connection with FIG. 22A, conventional synchronous buck converters typically rely on an H-Bridge topology and a single-polar or double-polar switching scheme to produce a steady DC output voltage. However, such configurations are subject to high power losses. Additionally, since conventional configurations rely on the load to pull the voltage down to zero, this may further introduce significant harmonic distortions, particularly with small loads.

Under some illustrative embodiments, the technologies and techniques described herein may be used for a synchronous buck converter to produce a steady DC output voltage. Under an illustrative embodiment shown in FIG. 23A, the synchronous switches S1 and S2 of the simplified figure may be configured as high frequency switches to have on/off states (an "on" state illustrated as dotted line in the figure) to cause current to flow through inductor L1 (illustrated as dotted line arrows in the figure) to produce a varying rectified sinusoid shown in FIG. 23B.

In some illustrative embodiments, low frequency switches may be added to the circuit of FIG. 23A. Turning to FIG. 24A, low-frequency switches S3 and S4 are added as shown in the simplified embodiment, and are configured to synchronously switch with switches S1 and S2 to actively pull down voltage to produce waveforms illustrated in FIG. 24B and FIG. 24C. In the simplified waveform illustrated in FIG. 24B, the switching of S3 and S4 is configured to "un-fold" or invert a portion 2410 of the rectified signal 2412 (in the direction of the arrow as shown) to produce a sine wave illustrated in FIG. 24C comprising signal 2410 and inverted portion 2412. In some illustrative embodiments, switches S1 and S2 may be fabricated from SiC or GaN (discussed above in connection with FIG. 22A) to provide further advantageous switching and circuit response properties. Using techniques described herein, reduced harmonic distortion may be advantageously achieved. With better control over harmonic distortion, bulky, low-frequency output inductors may be significantly reduced. Moreover, the disclosed configurations are much more responsive to load changes.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those of ordinary in the pertinent art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein. That is, the claims which follow are to be accorded their respective broadest scope in light of the exemplary disclosure made herein.

What is claimed is:

1. An inverter, comprising:
   a high frequency switching control circuit operatively coupled to a DC power input;
   a synchronous-buck circuit, operatively coupled to the high frequency switching control circuit and comprising a plurality of switches controlled by the high frequency switching control circuit to cyclically invert the DC power input; and
   a low frequency switching circuit for providing an oscillated output and operatively coupled to the synchronous buck circuit to provide zero voltage switching and zero current switching by driving an output capacitor circuit to discharge on each zero crossing of the low frequency switching circuit.

2. The inverter according to claim 1, wherein the high frequency switching control circuit comprises a controller and a sensing circuit.

3. The inverter according to claim 2, wherein the controller comprises a current-mode PWM controller.

4. The inverter according to claim 2, wherein the sensing circuit comprises at least one of a peak current sense and an output voltage sense.

5. The inverter according to claim 1, wherein the plurality of switches for the synchronous-buck circuit comprise field effect transistors (FETs).

6. The inverter according to claim 1, wherein the high frequency switching control circuit is configured to provide a low frequency sine wave to effect switching control on the synchronous-buck circuit.

7. The inverter according to claim 1, wherein the synchronous buck circuit comprises a plurality of drive circuits, each operatively coupled to a respective one of the plurality of switches.

8. The inverter according to claim 1, wherein one of the plurality of switches for the synchronous-buck circuit is configured to be active on a high frequency PWM for a positive half wave of the high frequency switching control circuit, and another of the plurality of switches for the synchronous-buck circuit is active on a high frequency PWM complement for the positive half wave of the high frequency switching control circuit.

9. The inverter according to claim 1, wherein one of the plurality of switches for the synchronous-buck circuit is configured to be active on a high frequency PWM for a negative half wave of the high frequency switching control circuit, and another of the plurality of switches for the synchronous-buck circuit is active on a high frequency PWM complement for the negative half wave of the high frequency switching control circuit.

10. The inverter according to claim 1, further comprising a dither circuit operatively coupled to the high frequency switching control circuit, wherein the dither circuit is configured to cause a frequency change in the switching control circuit.

11. The inverter according to claim 10, wherein the dithering circuit is configured to apply a waveform to the high frequency switching control circuit to cause the frequency change.

12. The inverter according to claim 11, wherein the dithering circuit is configured to apply a triangular waveform to the high frequency switching control circuit to cause the frequency change.

13. The inverter according to claim 10, wherein the dither circuit is configured to cause the frequency change in the switching control circuit by reducing a switching frequency at a zero crossing.

14. The inverter according to claim 1, wherein each of the plurality of switches for the synchronous buck circuit comprises one of Silicon Carbide switches and Gallium Nitride switches.

15. The inverter of claim 1, wherein the output capacitor circuit comprises a discharge capacitor operatively coupled to the oscillated output, the low frequency switching circuit and the synchronous buck circuit.

16. The inverter according to claim 1, wherein the high frequency switching control circuit is configured to provide a high frequency sine wave to effect switching control on the synchronous-buck circuit.

17. The inverter according to claim 15, wherein the synchronous buck circuit comprises a plurality of drive circuits.

18. The inverter according to claim 1, wherein the low frequency switching circuit comprises a plurality of drive circuits.

19. The inverter according to claim 1, wherein one aspect of the low frequency switching circuit is configured to be always on for one half wave of the high frequency switching control circuit, and another aspect of the low frequency switching circuit is always off for the one half wave of the low frequency switching circuit.

* * * * *